United States Patent
Chung et al.

(10) Patent No.: US 9,905,739 B2
(45) Date of Patent: Feb. 27, 2018

(54) LIGHT EMITTING PACKAGES

(71) Applicant: Samsung Electronics Co., Ltd., Suwon-si, Gyeonggi-do (KR)

(72) Inventors: Jin-wook Chung, Yongin-si (KR); Jung-jin Kim, Hwaseong-si (KR); Pun-jae Choi, Yongin-si (KR); Si-han Kim, Seoul (KR); Sung-don Gang, Goyang-si (KR); Ah-young Woo, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/341,293

(22) Filed: Nov. 2, 2016

(65) Prior Publication Data

US 2017/0133563 A1    May 11, 2017

(30) Foreign Application Priority Data

Nov. 9, 2015    (KR) .................. 10-2015-0156745

(51) Int. Cl.
*H01L 33/56* (2010.01)
*H01L 33/22* (2010.01)
(Continued)

(52) U.S. Cl.
CPC ............ *H01L 33/56* (2013.01); *H01L 33/382* (2013.01); *H01L 33/502* (2013.01); *H01L 33/60* (2013.01);
(Continued)

(58) Field of Classification Search
CPC ....... H01L 33/56; H01L 33/22; H01L 33/382; H01L 33/44; H01L 33/502; H01L 33/54; H01L 33/60
See application file for complete search history.

(56) References Cited

U.S. PATENT DOCUMENTS 5,327,012 A * 7/1994 Yano ................... H01L 23/5226
257/758
6,372,608 B1    4/2002 Shimoda et al.
(Continued)

FOREIGN PATENT DOCUMENTS

JP    2014-241400 A    12/2014
JP    2015-111636 A    6/2015

*Primary Examiner* — Ida M Soward
(74) *Attorney, Agent, or Firm* — Harness, Dickey & Pierce, P.L.C.

(57) ABSTRACT

A semiconductor light emitting device may include a light emitting package. A light emitting package may include a light emitting stack including a sequential stack of a first conductivity type semiconductor layer, an active layer, and a second conductivity type semiconductor layer. An encapsulation layer may at least partially surround the second conductivity type semiconductor layer, and a wavelength conversion layer may cover the first conductivity type semiconductor layer. One or more of the encapsulation layer and the wavelength conversion layer may have a greater coefficient of thermal expansion (CTE) than a GaN-based compound semiconductor. The semiconductor light emitting device may include a stress applying structure that may apply a tensile stress to the light emitting stack. The light emitting stack may have reduced thermal droop at an operation temperature and improved luminous efficiency.

20 Claims, 37 Drawing Sheets

(51) Int. Cl.
  *H01L 33/38* (2010.01)
  *H01L 33/44* (2010.01)
  *H01L 33/50* (2010.01)
  *H01L 33/54* (2010.01)
  *H01L 33/60* (2010.01)
  H01L 33/46 (2010.01)

(52) U.S. Cl.
  CPC .............. *H01L 33/22* (2013.01); *H01L 33/44* (2013.01); *H01L 33/46* (2013.01); *H01L 33/54* (2013.01)

(56) References Cited

U.S. PATENT DOCUMENTS

| | | |
|---|---|---|
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,525,208 B2 * | 9/2013 | Kanada ................ H01L 33/60 257/676 |
| 8,536,604 B2 | 9/2013 | Kwak et al. |
| 8,735,931 B2 | 5/2014 | Han et al. |
| 8,766,295 B2 | 7/2014 | Kim |
| 9,171,909 B2 * | 10/2015 | Zimmerman ....... H01L 29/2003 |
| 2008/0179609 A1 * | 7/2008 | Trottier ................ H01L 33/44 257/98 |
| 2013/0015483 A1 * | 1/2013 | Shimokawa ............ H01L 24/96 257/98 |
| 2013/0193464 A1 | 8/2013 | Bae et al. |
| 2013/0248910 A1 * | 9/2013 | Kimura ................ H01L 25/167 257/98 |
| 2013/0299777 A1 | 11/2013 | Nakamura et al. |
| 2013/0313588 A1 | 11/2013 | Kojima et al. |
| 2014/0048766 A1 * | 2/2014 | Chu ...................... H01L 33/505 257/13 |
| 2014/0377894 A1 | 12/2014 | Kwon et al. |
| 2015/0076546 A1 | 3/2015 | Obata et al. |
| 2015/0137164 A1 | 5/2015 | Ichikawa |
| 2015/0171281 A1 | 6/2015 | Nakabayashi et al. |
| 2015/0206785 A1 * | 7/2015 | Miyashita ........... C23C 16/4585 117/88 |
| 2015/0207046 A1 | 7/2015 | Ikegami et al. |
| 2015/0349201 A1 * | 12/2015 | Lee ........................ H01L 33/22 257/79 |
| 2016/0020198 A1 * | 1/2016 | Steigerwald ............ H01L 33/62 257/98 |
| 2016/0293809 A1 * | 10/2016 | Huang ................... H01L 33/58 |
| 2017/0133560 A1 * | 5/2017 | Basin .................... H01L 33/507 |

\* cited by examiner

LIGHT EMITTING PACKAGES

CROSS-REFERENCE TO RELATED APPLICATION

This application claims the benefit of Korean Patent Application No. 10-2015-0156745, filed on Nov. 9, 2015, in the Korean Intellectual Property Office, the disclosure of which is incorporated herein in its entirety by reference.

BACKGROUND

The inventive concepts relate to light emitting packages, semiconductor light emitting devices, light emitting modules, and fabricating same. More particularly, the inventive concepts relate to light emitting packages, semiconductor light emitting devices, light emitting modules, and fabricating same, in which thermal droop is reduced at an operation temperature and luminous efficiency is improved based on the reduction in thermal droop.

A light emitting device generates light based on emission of electromagnetic waves due to recombination of electrons and holes. In some cases, a thermal droop phenomenon may occur in some light emitting devices, where non-radiative electron-hole recombination increases when a temperature associated with the light emitting devices increases, occurs. Thus, the luminous efficiency of the light emitting device may deteriorate with increased associated temperature. Causes of thermal droop have been partially identified, but have not yet been thoroughly clarified, and continual development and improvement with respect to this is needed.

SUMMARY

The inventive concepts may provide a light emitting package in which thermal droop is reduced at an operation temperature and luminous efficiency is improved.

The inventive concepts may provide a semiconductor light emitting device in which thermal droop is reduced at an operation temperature and luminous efficiency is improved.

The inventive concepts may provide a light emitting module in which thermal droop is reduced at an operation temperature and luminous efficiency is improved.

The inventive concepts may provide a method of fabricating a light emitting package in which thermal droop is reduced at an operation temperature and luminous efficiency is improved.

In some example embodiments, a light emitting package may include: a light emitting stack including a sequential stack of a first conductivity type semiconductor layer, an active layer, and a second conductivity type semiconductor layer; an encapsulation layer at least partially surrounding the second conductivity type semiconductor layer; and a wavelength conversion layer on the first conductivity type semiconductor layer. At least one of the encapsulation layer and the wavelength conversion layer may have a greater coefficient of thermal expansion (CTE) than a compound semiconductor of $Al_xIn_yGa_zN$ ($0 \leq x \leq 1$, $0 \leq y \leq 1$, $0 \leq z \leq 1$, $x+y+z=1$).

The encapsulation layer or the wavelength conversion layer may have a greater CTE than GaN.

The encapsulation layer may have a greater CTE than GaN at 95° C. The encapsulation layer may have a greater CTE than GaN in a temperature range of about 50° C. to about 110° C.

The wavelength conversion layer may have a greater CTE than GaN in a temperature range of about 50° C. to about 110° C.

The encapsulation layer and the wavelength conversion layer may have CTEs greater than GaN in a temperature range of about at about 50° C. to about 110° C.

The encapsulation layer may have a CTE of about 10 ppm/K to about 100 ppm/K in a temperature range of about 50° C. to about 110° C.

The wavelength conversion layer may have a CTE of about 10 ppm/K to about 100 ppm/K, based on the wavelength conversion layer having a temperature of about 50° C. to about 110° C.

A deterioration rate of luminous flux may be less than −5% if a temperature of the light emitting package increases from about 25° C. to about 85° C.

An optical reflectance of the encapsulation layer may be about 80% to about 100%.

The encapsulation layer may have a glass transition temperature (Tg) that is equal to or less than about 60° C.

The encapsulation layer may have a CTE of about 65 ppm/K to about 95 ppm/K in a temperature range of about 50° C. to about 110° C.

The encapsulation layer may surround a side surface of the light emitting stack. The encapsulation layer may contact a surface of the second conductivity type semiconductor layer.

A surface of the first conductivity type semiconductor layer may be roughened. The surface of the first conductivity type semiconductor layer may face the wavelength conversion layer.

The light emitting package may further include a stress applying structure configured to apply tensile stress to the light emitting stack.

The stress applying structure may be on a surface of the encapsulation layer.

The surface of the encapsulation layer may face the wavelength conversion layer.

The surface of the encapsulation layer may be at an opposite side of the encapsulation layer, relative to the wavelength conversion layer.

In some example embodiments, a semiconductor light emitting device may include: a light emitting stack including a sequential stack of a first conductivity type semiconductor layer, an active layer, and a second conductivity type semiconductor layer; and a substrate supporting the light emitting stack. The light emitting stack may be configured to receive a tensile stress in a range of temperature at which the light emitting stack is supplied with power and emits light.

A coefficient of thermal expansion (CTE) of the substrate may be greater than an overall CTE of the light emitting stack.

The substrate may have a CTE of about 10 ppm/K to about 100 ppm/K in a temperature range of about 50° C. to about 110° C.

The semiconductor light emitting device may further include: an opening penetrating the second conductivity type semiconductor layer and the active layer and exposing the first conductivity type semiconductor layer; a first electrode electrically connected to the first conductivity type semiconductor layer via the opening; and a second electrode electrically connected to the second conductivity type semiconductor layer.

The semiconductor light emitting device may further include: an insulating layer on a side wall of the opening, the insulating layer configured to electrically insulate the second conductivity type semiconductor layer and the active layer from the first electrode.

In some example embodiments, a light emitting module may include: a printed circuit board (PCB); and the light emitting package, the light emitting package being mounted on the PCB.

The PCB may be a flexible PCB (FPCB).

In some example embodiments, a method of fabricating a light emitting package may include: forming, on a substrate, a light emitting stack, the light emitting stack including a sequential stack of a first conductivity type semiconductor layer, an active layer, and a second conductivity type semiconductor layer; forming an opening penetrating the second conductivity type semiconductor layer and the active layer and exposing the first conductivity type semiconductor layer; forming a first electrode and a second electrode, the first electrode being electrically coupled to the first conductivity type semiconductor layer, the second electrode being electrically coupled to the second conductivity type semiconductor layer; forming an encapsulation layer at least partially exposing the first electrode and the second electrode, the encapsulation layer at least partially encapsulating the light emitting stack, the encapsulation layer having a coefficient of thermal expansion (CTE) that is greater than an overall CTE of the light emitting stack; and forming a wavelength conversion layer on a light extraction surface of the light emitting stack.

The encapsulation layer may include a W-silicone or a W-liquid molding compound (W-LMC).

The method may further include: between the forming of the encapsulation layer and the forming of the wavelength conversion layer, removing the substrate, and roughening an exposed surface of the first conductivity type semiconductor layer.

The wavelength conversion layer may have a CTE of about 10 ppm/K to about 100 ppm/K in a temperature range of about 50° C. to about 110° C.

In some example embodiments, a light emitting package may include: a light emitting stack, the light emitting stack including a sequential stack of a first conductivity type semiconductor layer, an active layer, and a second conductivity type semiconductor layer; an encapsulation layer at least partially surrounding the second conductivity type semiconductor layer; and a wavelength conversion layer on the first conductivity type semiconductor layer. At least one of the encapsulation layer and the wavelength conversion layer may have a greater coefficient of thermal expansion (CTE) than an epoxy molding compound (EMC) and a liquid molding compound (LMC) in a temperature range of about 50° C. to about 110° C. C.

The light emitting package may further include: a first contact conductor layer electrically coupled to the first conductivity type semiconductor layer; and a second contact conductor layer electrically coupled to the second conductivity type semiconductor layer. The second contact conductor layer may contact a surface of the second conductivity type semiconductor layer, and the second contact conductor layer has a thickness of about 0.5 µm to about 2 µm.

The second contact conductor layer may be partially sheathed by an insulating layer. The insulating layer may have a thickness of about 0.5 µm to about 3 µm.

At least one of the encapsulation layer and the wavelength conversion layer may have a glass transition temperature that is equal to or less than 60° C. The at least one of the encapsulation layer and the wavelength conversion layer may have a CTE of about 65 ppm/K to about 95 ppm/K at a temperature that is equal to or greater than the glass transition temperature.

At least one of the encapsulation layer and the wavelength conversion layer may have a glass transition temperature that is equal to or less than 145° C. The at least one of the encapsulation layer and the wavelength conversion layer may have a CTE of about 30 ppm/K to about 60 ppm/K at a temperature that is equal to or greater than the glass transition temperature.

In some example embodiments, an apparatus may include: a light emitting stack, the light emitting stack including a sequential stack of a first conductivity type semiconductor layer, an active layer, and a second conductivity type semiconductor layer; and a stress applying structure configured to apply tensile stress to the light emitting stack.

The apparatus may further include an encapsulation layer at least partially surrounding the second conductivity type semiconductor layer. The stress applying structure may be on a surface of the encapsulation layer.

The apparatus may further include a wavelength conversion layer on the first conductivity type semiconductor layer. The surface of the encapsulation layer may face the wavelength conversion layer.

The surface of the encapsulation layer may be a distal surface of the encapsulation layer, relative to the wavelength conversion layer.

BRIEF DESCRIPTION OF THE DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION OF THE EMBODIMENTS

Figure 1:
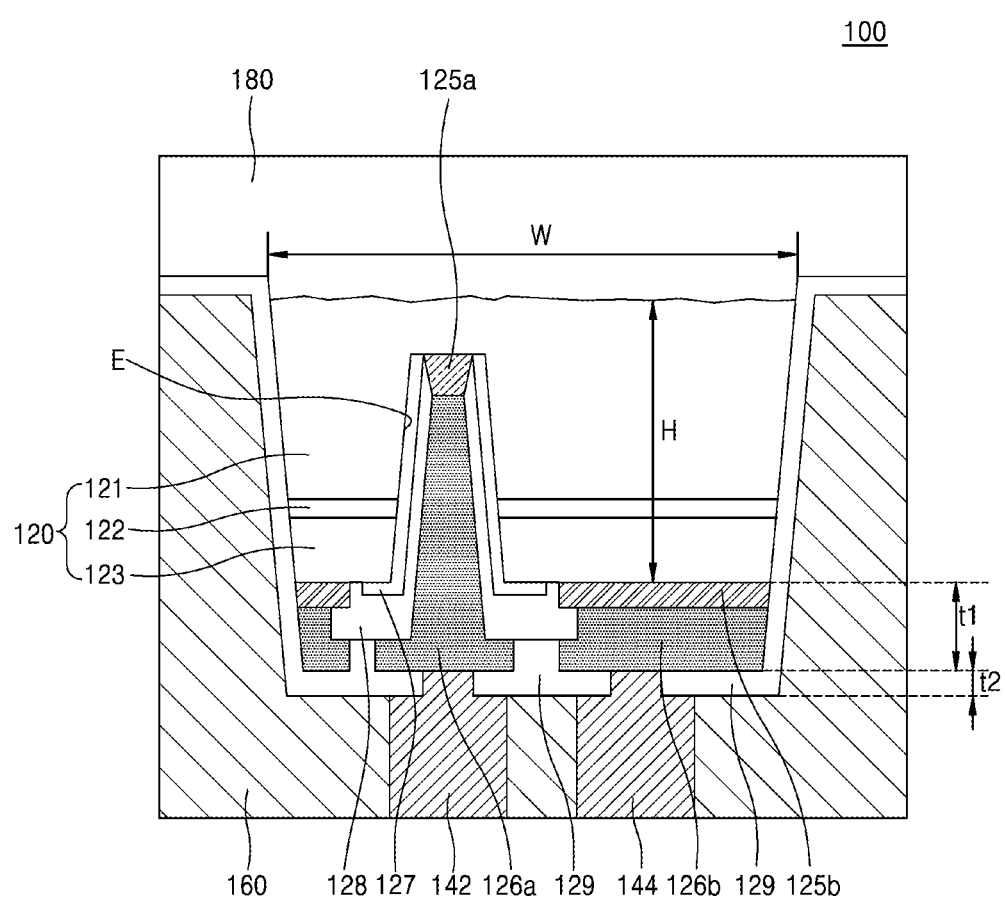
FIG. 1, FIG. 2, and FIG. 3 are cross-sectional views of light emitting packages according to some example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may not be repeated.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an etched region or an implanted region illustrated as a rectangle may have rounded or curved features. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a cross-sectional view of a light emitting package 100 according to some example embodiments.

Referring to FIG. 1, the light emitting package 100 includes a light emitting stack 120, an encapsulation layer 160 at least partially surrounding the light emitting stack 120, and a wavelength conversion layer 180 disposed to cover the light emitting stack 120. The light emitting stack 120 may be constructed to be applied with tensile stress if and/or when the light emitting stack 120 is at (e.g., "associated with") a temperature of about 50° C. to about 110° C. A source of the tensile stress applied to the light emitting stack 120 may be the encapsulation layer 160 and/or the wavelength conversion layer 180. In some example embodiments, the source of the tensile stress applied to the light emitting stack 120 may be an optical lens disposed above the light emitting stack 120. Aspects with respect to this will be described in detail later.

The light emitting stack 120 may include a sequential stack of a first conductivity type semiconductor layer 121, an active layer 122, and a second conductivity type semiconductor layer 123.

The first conductivity type semiconductor layer 121 may be a nitride semiconductor layer which includes n-type $In_xAl_yGa_{1-x-y}N$ (0≤x<1, 0≤y<1, 0 x+y<1). For example, the first conductivity type semiconductor layer 121 may include n-type GaN.

In some example embodiments, the first conductivity type semiconductor layer 121 may include a first conductivity type semiconductor contact layer and a current diffusion layer. The first conductivity type semiconductor contact layer may have an impurity concentration of about $1.2 \times 10^{18}$ per cubic centimeter ($cm^{-1}$) to about $2 \times 10^{19}$ per cubic centimeter. The first conductivity type semiconductor contact layer may have a thickness of about 1 μm to about 5 μm.

The current diffusion layer may have a structure in which a plurality of layers are repeatedly stacked. For example, the current diffusion layer may be an n-type superlattice layer obtained by repeatedly stacking two or more different-composition layers which include an n-type GaN layer and $Al_xIn_yGa_zN$ (0≤x≤1, 0≤y≤1, 0≤z≤1, x+y+z=1) having a thickness of about 1 nm to about 500 nm. The current diffusion layer may have an impurity concentration of $2 \times 10^{18}$ per cubic centimeter to $9 \times 10^{19}$ per cubic centimeter. The current diffusion layer may additionally include an insulating material layer, as needed. In some example embodiments, the current diffusion layer may be omitted.

The active layer 122 may have a multi-quantum well (MQW) structure in which a quantum well layer and a quantum barrier layer are alternately stacked. For example, the quantum well layer and the quantum barrier layer may be alternately stacked. For example, the quantum well layer, and the quantum barrier layer may be a GaN or AlGaN layer. Each of the quantum well layer and the quantum barrier layer may have a thickness of about 1 nm to about 50 nm. The active layer 122 is not limited to the multi-quantum well structure, and may have a single quantum well structure.

The second conductivity type semiconductor layer 123 may be a nitride semiconductor layer which includes p-type $In_xAl_yGa_{1-x-y}N$ (0≤x<1, 0≤y<1, 0 x+y<1), and the p-type impurity may be Mg. For example, the second conductivity type semiconductor layer 123 may have a single-layer structure, or may have a multi-layer structure, which includes multiple layers having different compositions. The second conductivity type semiconductor layer 123 may include an electron blocking layer (EBL), a low-concentration p-type GaN layer, and a high-concentration p-type GaN layer provided as a contact layer. For example, the electron blocking layer may have a structure in which a plurality of $In_xAl_yGa_{(1-x-y)}N$ layers having different compositions and thicknesses of about 5 nm to about 100 nm are stacked, or may be a single layer including $Al_yGa_{(1-y)}N$. The electron blocking layer may have an energy band gap (Eg) which decreases with increasing distance from the active layer 122. For example, the electron blocking layer may have an Al proportion which decreases with increasing distance from the active layer 122.

The light emitting stack 120 may have a thickness of about 5 μm to about 10 μm.

An exposed upper surface of the first conductivity type semiconductor layer 121 may be roughened. The roughening may have a regular pattern or an irregular pattern. Due to the roughening of the exposed upper surface, total reflection of light emitted from the light emitting stack 120 may decrease to increase a light extraction efficiency of the light emitting package 100.

An opening E may be formed to penetrate the second conductivity type semiconductor layer 123 and the active layer 122 of the light emitting stack 120 and expose a portion of the first conductivity type semiconductor layer 121. A first insulating layer 127 may sheathe an inner side wall of the opening E and a portion of a lower surface of the second conductivity type semiconductor layer 123. A first contact 125a is provided to contact the first conductivity type semiconductor layer 121 exposed in the opening E. Also, a second contact 125b is provided at a surface of the second conductivity type semiconductor layer 123. A second insulating layer 128 may be arranged to electrically insulate the first contact 125a and the second contact 125b from each other. Each of the first contact 125a and the second contact 125b may be a reflective material layer including any one of Ag, Al, Ni, Cr, Cu, Au, Pd, Pt, Sn, W, Rh, Ir, Ru, Mg, Zn, and an alloy thereof.

A first connectivity unit 126a burying the opening E may electrically contact the first contact 125a. Also, a second connectivity unit 126b disposed at a lower surface of the second contact 125b may electrically contact the second contact 125b. A third insulating layer 129 may be provided between the first connectivity unit 126a and the second connectivity unit 126b to electrically insulate the first connectivity unit 126a and the second connectivity unit 126b from each other.

A sum t1 of thicknesses of the second contact 125b and the second connectivity unit 126b may be about 0.5 μm to about 2 μm. If the sum t1 is too small, resistance may become excessive and the current spreading may be low. If the sum t1 is too big, tensile stress as described later may not be sufficiently transmitted to the light emitting stack 120.

A thickness t2 of the third insulating layer 129 may be about 0.5 μm to about 3 μm. If the thickness t2 of the third insulating layer 129 is too small, short may occur. If the thickness t2 of the third insulating layer 129 is too big, tensile stress as described later may not be sufficiently transmitted to the light emitting stack 120.

The first connectivity unit 126a and the second connectivity unit 126b may electrically contact a first metal post 142 and a second metal post 144, respectively. Each of the first metal post 142 and the second metal post 144 may include Cu. However, the first metal post 142 and the second metal post 144 are not limited thereto, and may include a certain conductive material.

The encapsulation layer 160 may at least partially surround the light emitting stack 120, in particular, the second conductivity type semiconductor layer 123. In some example embodiments, the encapsulation layer 160 may expose a surface of the light emitting stack 120, from which generated light is emitted, and lower surfaces of the first metal post 142 and the second metal post 144, which contact external power, and may bury the light emitting stack 120.

The encapsulation layer 160 may include a material having a Young's modulus that is sufficiently high to support the light emitting stack 120. For example, the encapsulation layer 160 may include a material having a Young's modulus that is about 0.4 GPa to about 20 GPa. If the Young's modulus of the encapsulation layer 160 is too low, the encapsulation layer 160 may not protect and support the light emitting stack 120 well. If the Young's modulus of the encapsulation layer 160 is too high, the reliability of the encapsulation layer 160 increases, but the optical reflectance of the encapsulation layer 160 deteriorates, and the light extraction efficiency may decrease.

In some example embodiments, the encapsulation layer 160 may have a greater coefficient of thermal expansion (CTE) than the light emitting stack 120. Here, the CTE denotes a linear CTE, and may have, for example, a unit of ppm/K.

In some example embodiments, the encapsulation layer 160 may have a greater CTE than a compound semiconductor of $Al_xIn_yGa_zN$ ($0 \leq x \leq 1$, $0 \leq y \leq 1$, $0 \leq z \leq 1$, $x+y+z=1$). In particular, the encapsulation layer 160 may have a greater CTE than GaN. In particular, the encapsulation layer 160 may have a greater CTE than GaN at 95° C. In particular, the encapsulation layer 160 may have the greater CTE than GaN in a temperature range of about 50° C. to about 110° C.

In some example embodiments, the encapsulation layer 160 may have a CTE that is greater than an overall CTE of the light emitting stack 120 in a temperature range of about 50° C. to about 110° C. The light emitting stack 120 may include different material layers having different CTEs. Thus, a CTE of the light emitting stack 120 may not be represented by a CTE of any one material layer. Rather, the CTE of the light emitting stack 120 may be represented by an overall CTE, in which effects of separate CTEs of the overall light emitting stack 120 are summed. In some example embodiments, the overall CTE of the light emitting stack 120 is a sum of the separate CTEs of the layers 121, 122, and 123. In some example embodiments, the overall CTE of the light emitting stack is an average of the separate CTEs of the layers 121, 122, and 123. The overall CTE of the light emitting stack 120 may be experimentally obtained, or may be arithmetically calculated from a thickness, etc. of the overall CTE of the separate material layers.

The encapsulation layer 160 may have a CTE of about 10 ppm/K to about 100 ppm/K in a temperature range of about 50° C. to about 110° C. If the CTE is too small, tensile stress as described later may not be applied to the light emitting stack 120, and thus, the luminous efficiency of the light emitting package 100 may deteriorate, and thermal droop may not be reduced.

If the CTE of the encapsulation layer 160 is too big, a CTE difference between the encapsulation layer 160 and the light emitting stack 120 may become excessive and the light emitting stack 120 may be fractured.

The encapsulation layer 160 may have an optical reflectance of about 80% to about 100%. That is, about 80% to about 100% of the light irradiated onto the encapsulation layer 160 may be reflected.

In particular, when a glass transition temperature (Tg) of the encapsulation layer 160 is relatively low, the encapsulation layer 160 may have a relatively greater CTE. In particular, when the glass transition temperature (Tg) of the encapsulation layer 160 is lower than a general operation temperature of the light emitting package 100, the encapsulation layer 160 may have a relatively great CTE. The encapsulation layer 160 may have a glass transition temperature (Tg) that is between about 30° C. and about 60° C. For example, the encapsulation layer 160 may have a CTE of about 65 ppm/K to about 95 ppm/K at a temperature between about 50° C. and about 110° C.

A temperature of the light emitting package 100 under a condition in which the light emitting package 100 operates may be about 50° C. to about 110° C. At the described temperature range, the CTE of the encapsulation layer 160 is greater than the overall CTE of the light emitting stack 120, and thus, tensile stress is applied to the light emitting stack 120. FIG. 1 may exaggerate a width W and a thickness H of the light emitting stack 120 for clarity, and when the width W is sufficiently greater than the thickness H, the light emitting stack 120 may be applied with the tensile stress as described above due to expansion of the encapsulation layer 160. For example, the thickness H may be about 5 μm to about 10 μm. For example, the width W may be about 100 μm to about 1000 μm.

In some example embodiments, the encapsulation layer 160 may include, for example, a white silicone (W-silicone) resin, a white liquid molding compound (W-LMC), etc. In some example embodiments, metal particles or metal oxide particles for improving optical reflectance may be mixed in the encapsulation layer 160. Here, the encapsulation layer 160 may have a greater CTE than an epoxy molding compound (EMC) and a liquid molding compound (LMC). In some example embodiments, the encapsulation layer 160 may have a greater CTE than the EMC and the LMC in a temperature range of about 50° C. to about 110° C.

In more detail, the W-LMC may be an LMC including ceramic oxide particles, such as $TiO_2$, ZnO, $SiO_2$, etc., and may be an epoxy-based material. In particular, the W-LMC may have a glass transition temperature (Tg) that is equal to or lower than about 145° C. The W-LMC may have a CTE of about 30 ppm/K to about 60 ppm/K at a temperature that is equal to or higher than the glass transition temperature (Tg). For example, the W-LMC may have a CTE of about 40 ppm/K at the temperature that is equal to or higher than about 145° C.

In more detail, W-Silicone may be a modified silicone material including ceramic oxide particles, such as $TiO_2$, ZnO, $SiO_2$, etc. In particular, W-Silicone may have a glass transition temperature (Tg) that is equal to or lower than about 60° C. W-Silicone may have a CTE of about 65 ppm/K to about 95 ppm/K at a temperature that is equal to or higher than the glass transition temperature (Tg). For example, W-Silicone may have a CTE of about 80 ppm/K at the temperature that is equal to or higher than about 60° C.

In some example embodiments, an internal quantum efficiency (IQE) of the light emitting stack 120 may be improved due to the tensile stress applied to the light emitting stack 120, and thus, thermal droop associated with the light emitting stack 120 may be reduced.

The wavelength conversion layer 180 may be on (may be disposed to cover) the first conductivity type semiconductor layer 121. The wavelength conversion layer 180 may include a phosphor in a resin matrix. The resin matrix may include transparent resins. The wavelength conversion layer 180 may convert wavelengths of light emitted from the light emitting stack 120. In some example embodiments, the phosphor may absorb at least a portion of the light emitted from the light emitting stack 120, and then, may emit light having different wavelengths from the light emitted from the light emitting stack 120.

Figure 2:
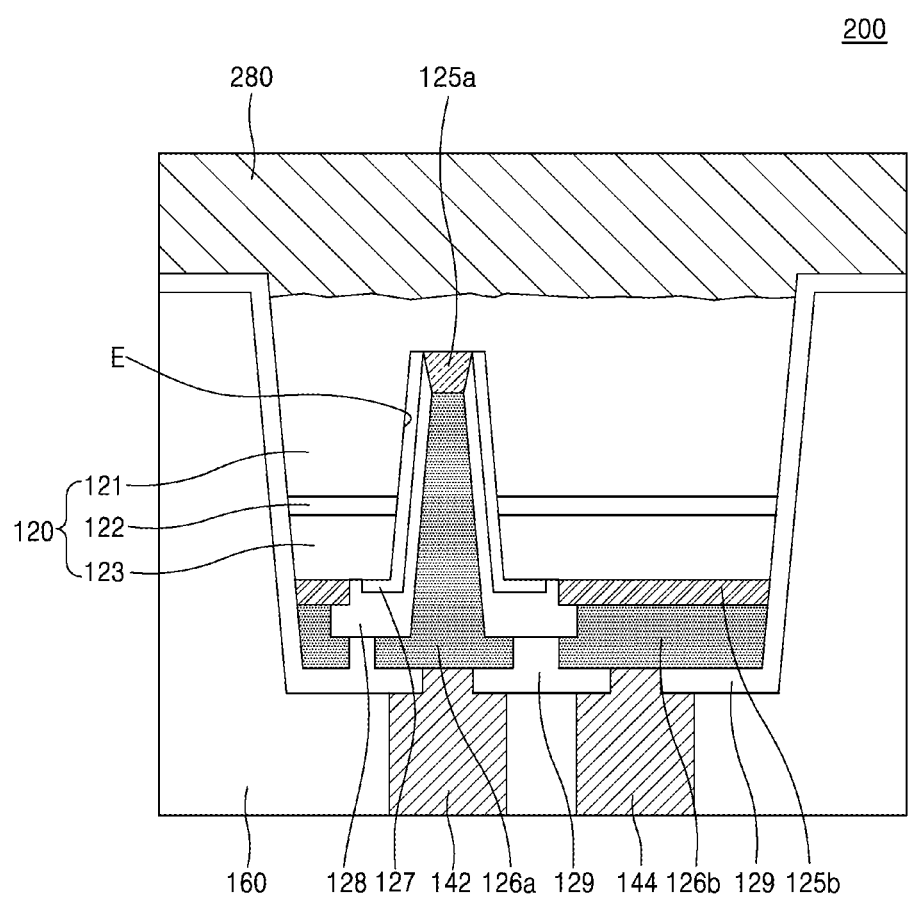

FIG. 2 is a cross-sectional view of a light emitting package 200 according to some example embodiments.

Referring to FIG. 2, an overall structure of the light emitting package 200 is substantially the same as the light emitting package 100 of FIG. 1, and thus, the same aspects are omitted for brevity of explanation, and descriptions will be given focusing on differences.

In some example embodiments, a wavelength conversion layer 280 may have a greater CTE than a compound semiconductor of $Al_xIn_yGa_zN$ ($0 \leq x \leq 1$, $0 \leq y \leq 1$, $0 \leq z \leq 1$, $x+y+z=1$). In particular, the wavelength conversion layer 280 may have a greater CTE than GaN. In particular, the wavelength conversion layer 280 may have the greater CTE than GaN in a temperature range of about 50° C. to about 110° C.

In some example embodiments, a CTE of a material included in the wavelength conversion layer 280 of the light emitting package 200 may be greater than an overall CTE of the light emitting stack 120. Here, the CTE also denotes a linear CTE, and it is the same throughout the specification.

The wavelength conversion layer 280 may have a CTE that is greater than the overall CTE of the light emitting stack 120 in a temperature range of about 50° C. to about 110° C. In more detail, the resin matrix mainly included in the wavelength conversion layer 280 may have the CTE that is greater than the overall CTE of the light emitting stack 120 in a temperature range of about 50° C. to about 110° C.

The wavelength conversion layer 280 may have a CTE of about 10 ppm/K to about 100 ppm/K in a temperature range of about 50° C. to about 110° C. If the CTE is too small, tensile stress as described later may not be applied to the light emitting stack 120, and thus, the luminous efficiency of the light emitting package 200 may deteriorate, and thermal droop may not be reduced.

If the CTE of the wavelength conversion layer 280 is too big, a CTE difference between the wavelength conversion layer 280 and the light emitting stack 120 may become excessive, and the light emitting stack 120 may be fractured.

In some example embodiments, the resin matrix of the wavelength conversion layer 280 may include, for example, a silicone resin, a W-silicone resin, a W-LMC, etc. Here, the wavelength conversion layer 280 may have a greater CTE than an EMC and an LMC. In some example embodiments, the wavelength conversion layer 280 may have a greater CTE than the EMC and the LMC at about 50° C. to about 110° C.

In particular, when a glass transition temperature (Tg) of the wavelength conversion layer 280 is relatively low, the wavelength conversion layer 280 may have a relatively greater CTE. In particular, when the glass transition temperature (Tg) of the wavelength conversion layer 280 is lower than a general operation temperature of the light emitting package 200, the wavelength conversion layer 280 may have a relatively great CTE. The wavelength conversion layer 280 may have a glass transition temperature (Tg) that is equal to or lower than about 60° C. For example, the wavelength conversion layer 280 may have a CTE of about 65 ppm/K to about 95 ppm/K at a temperature between about 50° C. and about 110° C.

A temperature of the light emitting package 200 under a condition in which the light emitting package 200 operates may be about 50° C. to about 110° C. At the described temperature range, the CTE of the wavelength conversion layer 280 is greater than the overall CTE of the light emitting stack 120, and thus, tensile stress is applied to the light emitting stack 120. As a result, IQE of the light emitting stack 120 may be increased, and thus, thermal droop may be reduced.

The encapsulation layer 160 of the light emitting package 200 may include, for example, an LMC, an EMC, etc.

Figure 3:
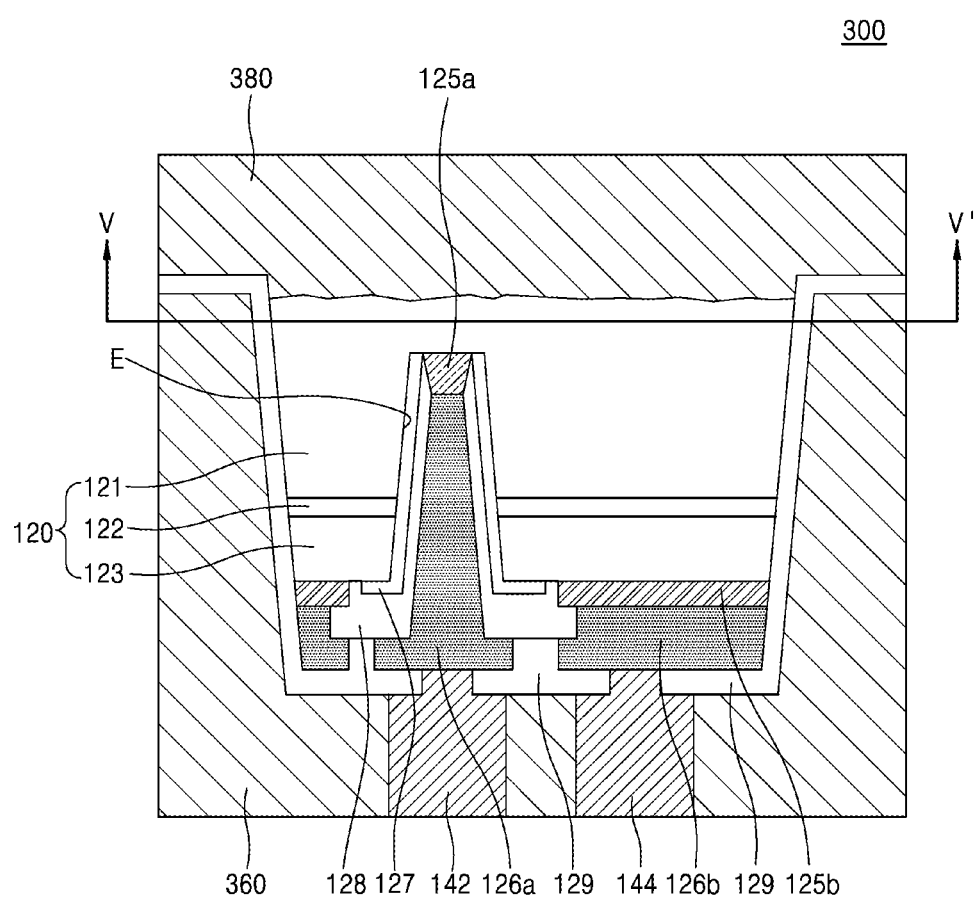

FIG. 3 is a cross-sectional view of a light emitting package 300 according to some example embodiments.

Referring to FIG. 3, an overall structure of the light emitting package 300 is substantially the same as the light emitting package 100 of FIG. 1 and the light emitting package 200 of FIG. 2, and thus, the same aspects are omitted for brevity of explanation, and descriptions will be given focusing on differences.

In some example embodiments, the encapsulation layer 360 and the wavelength conversion layer 380 may have a greater CTE than a compound semiconductor of $Al_xIn_yGa_zN$ ($0 \leq x \leq 1$, $0 \leq y \leq 1$, $0 \leq z \leq 1$, $x+y+z=1$). In particular, the encapsulation layer 360 and the wavelength conversion layer 380 may have a greater CTE than GaN. In particular, the encapsulation layer 360 and the wavelength conversion layer 380 may have the greater CTE than GaN at about 50° C. to about 110° C.

In some example embodiments, a CTE of a material included in the encapsulation layer 360 of the light emitting package 300 and a CTE of a material included in the wavelength conversion layer 380 are greater than an overall CTE of the light emitting stack 120. The encapsulation layer 360 and the wavelength conversion layer 380 may have the CTEs that are greater than the overall CTE of the light emitting stack 120 in a temperature range of about 50° C. to about 110° C. In more detail, a resin matrix mainly included in the wavelength conversion layer 380 may have a greater CTE than the overall CTE of the light emitting stack 120 in a temperature range of about 50° C. to about 110° C.

The encapsulation layer 360 and the wavelength conversion layer 380 may have a CTE of about 10 ppm/K to about 100 ppm/K in a temperature range of about 50° C. to about 110° C. If the CTE is too small, tensile stress as described later may not be applied to the light emitting stack 120, and thus, the luminous efficiency of the light emitting package 300 may deteriorate, and thermal droop may not be reduced.

If the CTEs of the encapsulation layer 360 and the wavelength conversion layer 380 are too big, a CTE difference between the encapsulation layer 360 and the wavelength conversion layer 380, and the light emitting stack 120 becomes too excessive, and thus, the light emitting stack 120 may be fractured.

In some example embodiments, the encapsulation layer 360 may include, for example, a W-silicone resin, a W-LMC, etc. In some example embodiments, metal particles or metal oxide particles for improving optical reflectance may be mixed in the encapsulation layer 360. In some example embodiments, the resin matrix of the wavelength conversion layer 380 may include, for example, a silicone resin, a W-silicone resin, a W-LMC, etc.

Here, the encapsulation layer 360 and the wavelength conversion layer 380 may have greater CTEs than an EMC and an LMC. In some example embodiments, the encapsulation layer 360 and the wavelength conversion layer 380 may have greater CTEs than the EMC and the LMC in a temperature range of about 50° C. to about 110° C.

In particular, when glass transition temperatures (Tg) of encapsulation layer 360 and the wavelength conversion layer 380 are relatively low, the encapsulation layer 360 and the wavelength conversion layer 380 may have relatively greater CTEs. In particular, when the glass transition temperatures (Tg) of the encapsulation layer 360 and the wavelength conversion layer 380 are lower than a general operation temperature of the light emitting package 300, the encapsulation layer 360 and the wavelength conversion layer 380 may have relatively great CTEs. For example, the encapsulation layer 360 and the wavelength conversion layer 380 may have glass transition temperatures (Tg) that are equal to or lower than about 60° C., and may have CTEs of about 65 ppm/K to about 95 ppm/K at a temperature between about 50° C. and about 110° C.

A temperature of the light emitting package 300 under a condition in which the light emitting package 300 operates may be about 50° C. to about 110° C. At the described temperature range, the CTEs of the encapsulation layer 360 and the wavelength conversion layer 380 are greater than the overall CTE of the light emitting stack 120, and thus, tensile stress is applied to the light emitting stack 120. In particular, the tensile stress is applied to both an upper surface and a lower surface of the light emitting stack 120, and thus, thermal droop may be more significantly reduced.

Figure 4:
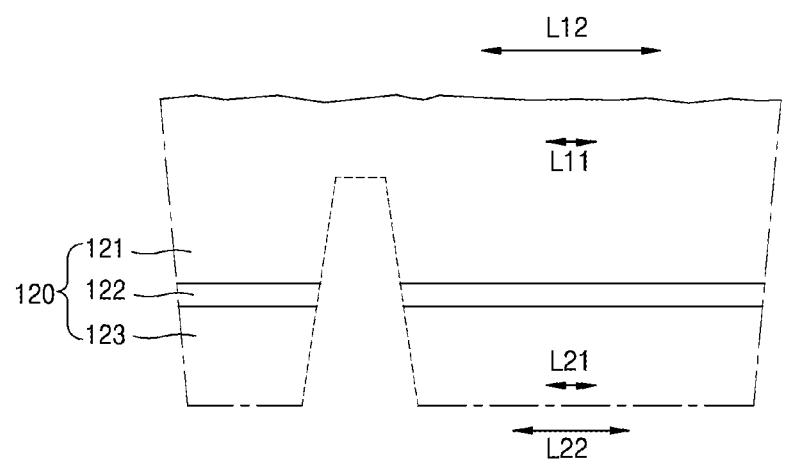
FIG. 4 is a sectional side view of a light emitting stack according to some example embodiments.
Figure 5:
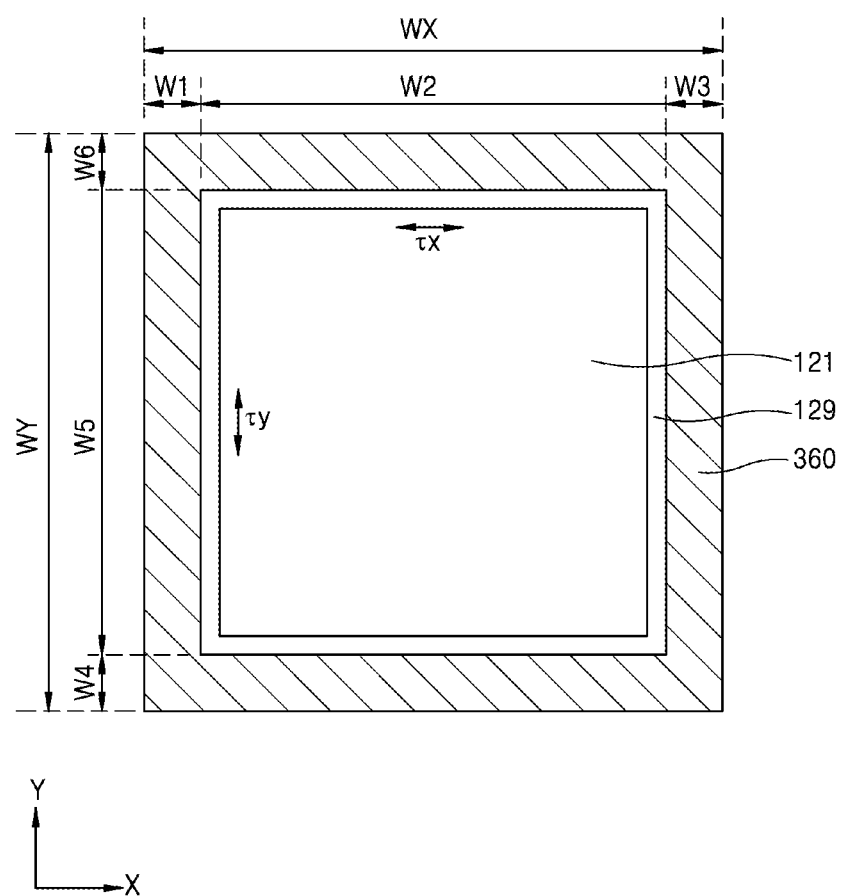
FIG. 5 is a cross-sectional view taken along a line V-V' of the light emitting package of FIG. 3.

FIG. 4 is a sectional side view of the light emitting stack 120 that schematically shows an order relation of stress applied to the light emitting stack 120 according to thermal expansion. FIG. 5 is a cross-sectional view taken along line V-V' of the light emitting package 300 of FIG. 3.

Referring to FIGS. 3 through 5, in correspondence to a desired (and/or alternatively predetermined) temperature change, the wavelength conversion layer 380 may have a length change in a side direction by L12, and the encapsulation layer 360 may have a length change in a side direction by L22.

The "desired temperature change" may denote, for example, a temperature change between a room temperature of approximate 25° C. and a temperature of the operating light emitting package 300. The temperature of the light emitting package 300 does not infinitely increase according to the operation. When the temperature of the light emitting package 300 reaches a certain point of temperature, a heat energy generating speed and a heat emitting speed are in equilibrium, and thus, from this point on, the light emitting package 300 may maintain a constant temperature. The temperature at which the heat energy generating speed and the heat emitting speed are in equilibrium varies according to a heat emission structure. However, in general, a thermal steady state may be achieved at about 50° C. to about 110° C. Therefore, the "desired temperature change" may be understood, for example, as a temperature change between the room temperature and the operation temperature at which the thermal steady state is achieved.

While the desired (and/or alternatively predetermined) temperature change occurs, the overall CTE of the light emitting stack 120 is smaller than the CTE of the encapsulation layer 360 or the wavelength conversion layer 380, and thus, a length change of the light emitting stack 120 in a side direction thereof is smaller than the length change of the encapsulation layer 360 or the wavelength conversion layer 380. A portion of the light emitting stack 120, which is adjacent to the wavelength conversion layer 380, in particular, an upper portion of the first conductivity semiconductor layer 121, may have a length change in a side direction by L11. Also, a portion of the light emitting stack 120, which is adjacent to the encapsulation layer 360, in particular, a lower portion of the second conductivity semiconductor layer 123, may have a length change in a side direction by L21. The length changes L11 and L21 in the light emitting stack 120 are smaller than the length changes L12 and L22 of the corresponding adjacent layers, and thus, the light emitting stack 120 is applied with tensile stress in a side direction.

Referring to FIG. 5, which shows a section of the light emitting package 300 of FIG. 3 from above, a width WX of the encapsulation layer 360 in an x direction may include a first width W1 that is a width of a portion extending in a y direction, a second width W2 that is a width of a portion extending in the x direction, and a third width W3 that is a width of a portion extending in the y direction from an opposite side of the first width W1. The first width W1 to the third width W3 have increased lengths in the x direction due to the desired (and/or alternatively predetermined) temperature change. Likewise, with respect to the y direction of the encapsulation layer 360, a fourth width W4, a fifth width W5, and a sixth width W6 have increased lengths due to the desired (and/or alternatively predetermined) temperature change.

Since the length change of the width WX of the encapsulation layer 360 in the x direction is greater than the length change of the first conductivity type semiconductor layer 121 in the x direction, the first conductive type semiconductor layer 121 may experience a tensile stress $\tau x$ in the x direction. Likewise, with respect to the y direction of the encapsulation layer 360, the first conductivity type semiconductor layer 121 may experience a tensile stress $\tau y$ in the y direction.

Due to the tensile stress formed as described above, the IQE of the light emitting stack 120 may be improved as described above. Accordingly, thermal droop of the light emitting stack 120 (e.g., thermal droop associated with the light emitting stack 120) may be reduced, and the luminous efficiency may be improved.

Figure 6:
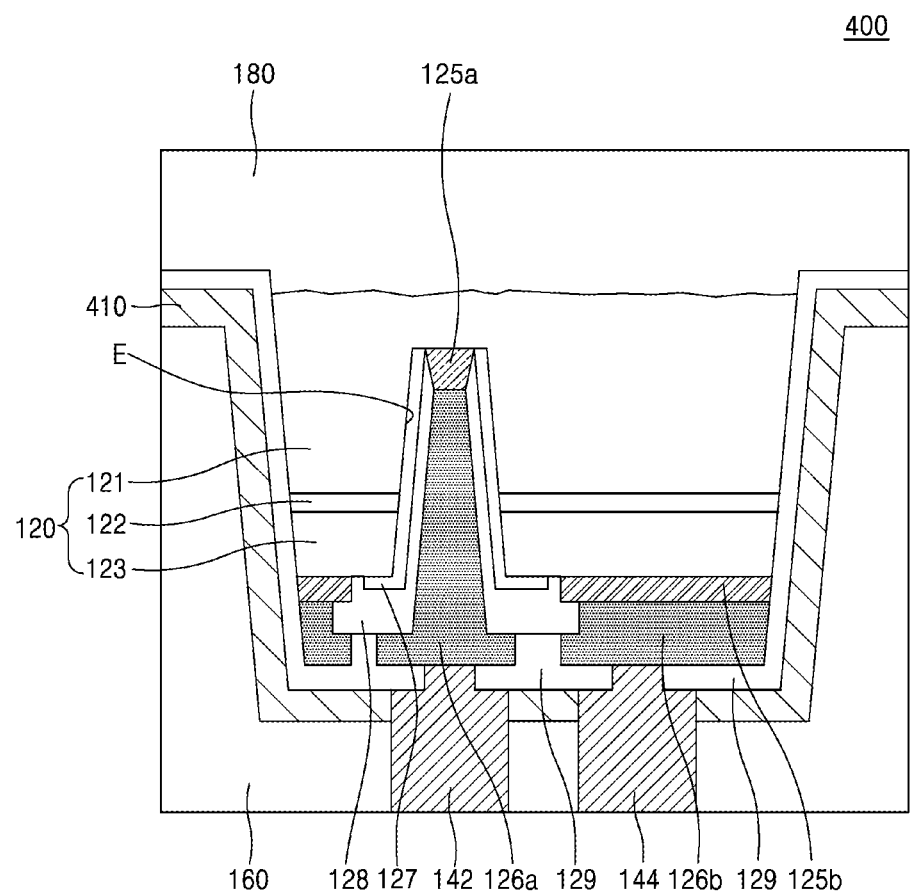
FIG. 6, FIG. 7, and FIG. 8 are cross-sectional views of light emitting packages according to some example embodiments.

FIG. 6 is a sectional side view of a light emitting package 400 according to some example embodiments.

Referring to FIG. 6, a stress applying structure 410 is provided between the light emitting stack 120 and the encapsulation layer 160. The stress applying structure may be configured to apply a tensile stress to the light emitting stack 120.

In some example embodiments, the stress applying structure 410 may be provided along a surface of the third insulating layer 129.

In some example embodiments, the stress applying structure 410 may have a greater CTE than a compound semiconductor of $Al_xIn_yGa_zN$ ($0 \leq x \leq 1$, $0 \leq y \leq 1$, $0 \leq z \leq 1$, $x+y+z=1$). In particular, the stress applying structure 410 may have a greater CTE than GaN. In particular, the stress applying structure 410 may have the greater CTE than GaN in a temperature range of about 50° C. to about 110° C.

In some example embodiments, the stress applying structure 410 may include a material having a CTE that is greater than an overall CTE of the light emitting stack 120. In particular, the stress applying structure 410 may include the material having the CTE that is greater than the overall CTE of the light emitting stack 120 in a temperature range of about 50° C. to about 110° C.

The stress applying structure 410 may have a CTE of about 10 ppm/K to about 100 ppm/K in a temperature range of about 50° C. to about 110° C. If the CTE of the stress applying structure 410 is too small, the stress applying structure 410 may not apply tensile stress to the light emitting stack 120, and thus, the luminous efficiency of the light emitting package 400 may deteriorate, and thermal droop may not be reduced.

If the CTE of the stress applying structure 410 is too big, a CTE difference between the stress applying structure 410 and the light emitting stack 120 may become excessive, and the light emitting stack 120 may be fractured.

When a glass transition temperature (Tg) of the stress applying structure 410 is relatively low, the stress applying structure 410 may have a relatively greater CTE. In particular, when the stress applying structure includes a polymer material, and the glass transition temperature (Tg) thereof is lower than a general operation temperature of the light emitting package 400, the stress applying structure 410 may have a relatively great CTE. The stress applying structure 410 may have a glass transition temperature (Tg) that is equal to or less than about 60° C. For example, the stress applying structure 410 may have a CTE of about 65 ppm/K to about 95 ppm/K at a temperature between about 50° C. and about 110° C.

The stress applying structure 410 may include, for example, a silicone resin, a W-silicone resin, a W-LMC, etc. In some example embodiments, metal particles or metal oxide particles for improving optical reflectance may be mixed in the stress applying structure 410.

When the temperature of the light emitting package 400 increases, the stress applying structure 410 expands in a side direction (a rostrocaudal direction in some sections) and tensile stress generated due thereto may be indirectly transmitted to the light emitting stack 120 through the third insulating layer 129. Due to the transmitted tensile stress, the IQE of the light emitting stack 120 may be improved as described above. Thus, thermal droop of the light emitting stack 120 may be reduced and also the luminous efficiency may be improved.

Figure 7:
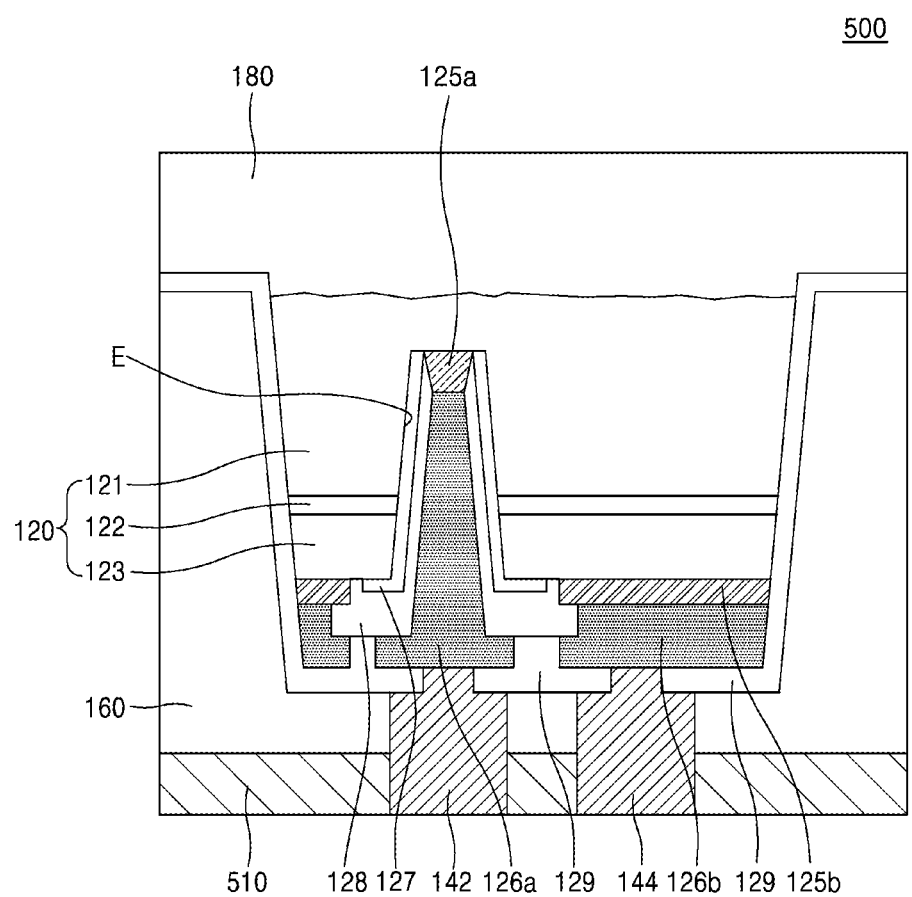

FIG. 7 is a sectional side view of a light emitting package 500 according to some example embodiments.

Referring to FIG. 7, a stress applying structure 510 is provided above an exposed surface of the encapsulation layer 160. That is, the stress applying structure 510 may be formed on the surface of the encapsulation layer 160, more particularly, on the surface that is opposite to a surface at which the light emitting stack 120 is located (e.g., a distal surface of the encapsulation layer 160, relative to the light emitting stack 120). However, in this case also, the first metal post 142 and the second metal post 144 may be exposed via the stress applying structure 510 for electrical contact with an external circuit.

Materials, thermal properties, etc. of the stress applying structure 510 are the same as those of the stress applying structure 410 of FIG. 6, and thus, additional descriptions are omitted.

When the stress applying structure 510 expands in a side direction due to a temperature increase, tensile stress in the side direction generated due thereto may be transmitted to the light emitting stack 120 through the encapsulation layer 160. Due to the transmitted tensile stress, the IQE in the light emitting stack 120 may be improved as described above. Thus, thermal droop of the light emitting stack 120 may be reduced and also the luminous efficiency may be improved.

Figure 8:
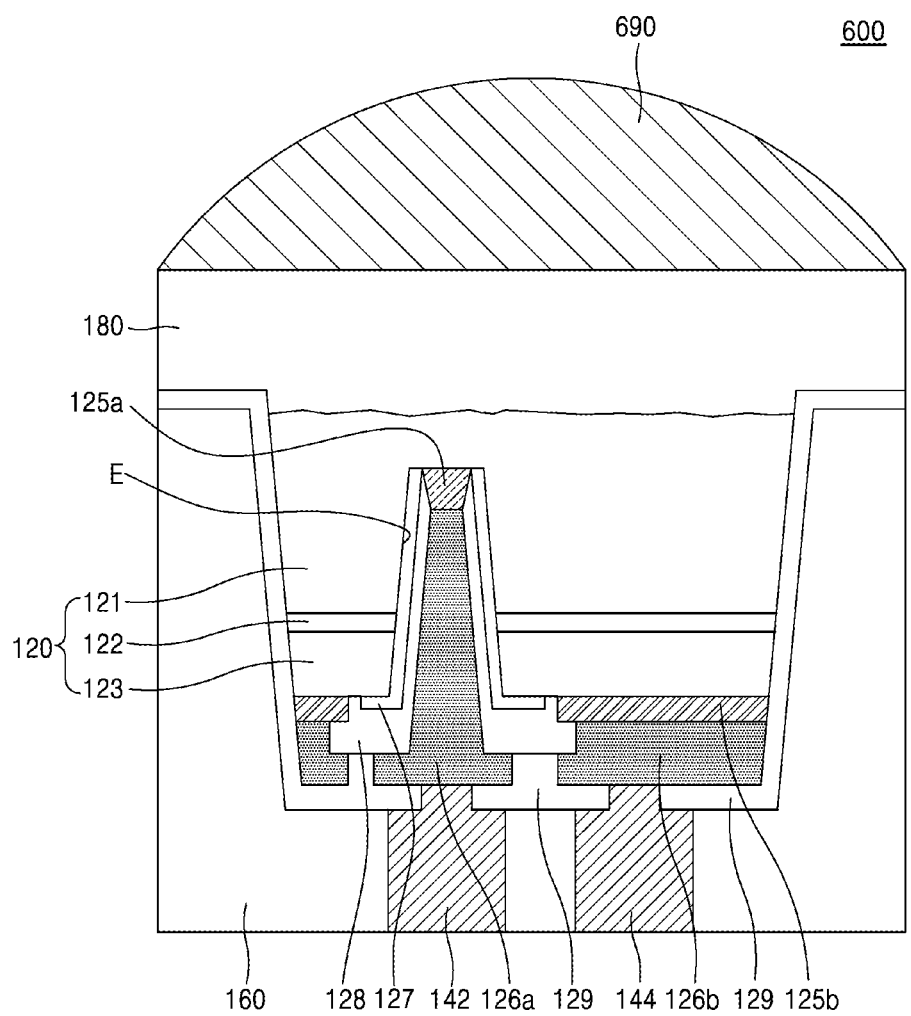

FIG. 8 is a sectional side view of a light emitting package 600 according to some example embodiments.

Referring to FIG. 8, a lens structure 690 may be provided above a surface of the wavelength conversion layer 180. The lens structure 690 may be optically transparent with respect to at least a visible ray area. Also, although it is illustrated in FIG. 8 that the lens structure 690 has a dome-shaped structure having a convex upper surface, the surface of the lens structure 690 may have a convex or a concave shape according to some example embodiments. Thus, a beam angle of the light emitted via the lens structure 690 may be adjusted.

In some example embodiments, the lens structure 690 may have a greater CTE than a compound semiconductor of $Al_xIn_yGa_zN$ ($0 \leq x \leq 1$, $0 \leq y \leq 1$, $0 \leq z \leq 1$, $x+y+z=1$). In particular, the lens structure 690 may have a greater CTE than GaN. In particular, the lens structure 690 may have the greater CTE than GaN in a temperature range of about 50° C. to about 110° C.

In some example embodiments, the lens structure 690 may have a greater CTE than the light emitting stack 120. In particular, the lens structure 690 may have a CTE that is greater than an overall CTE of the light emitting stack 120 at about 50° C. to about 110° C.

The lens structure 690 may have a CTE of about 10 ppm/K to about 100 ppm/K in a temperature range of about 50° C. to about 110° C. If the CTE is too small, tensile stress as described later may not be applied to the light emitting stack 120, and thus, the luminous efficiency of the light emitting package 600 may deteriorate, and thermal droop may not be reduced.

If the CTE of the lens structure 690 is too big, cracks may occur between the lens structure 690 and the wavelength conversion layer 180.

When a glass transition temperature (Tg) of the lens structure 690 is relatively low, the lens structure 690 may have a relatively greater CTE. In particular, when the lens structure 690 includes a polymer material, and the glass transition temperature (Tg) thereof is lower than a general operation temperature of the light emitting package 600, the lens structure 690 may have a relatively great CTE. The lens structure 690 may have a glass transition temperature (Tg) that is equal to or less than about 60° C. For example, the lens applying structure 690 may have a CTE of about 65 ppm/K to about 95 ppm/K at a temperature between about 50° C. and about 110° C.

The lens structure 690 may include, for example, a silicone resin, a W-silicone resin, a W-LMC, etc. In some example embodiments, metal particles or metal oxide particles for improving optical reflectance may be mixed in the lens structure 690.

When the temperature of the light emitting package 600 increases, the lens structure 690 expands in a side direction, and tensile stress generated due thereto may be indirectly transmitted to the light emitting stack 120 through the wavelength conversion layer 180. Due to the transmitted tensile stress, the IQE in the light emitting stack 120 may be improved, as described above. Thus, thermal droop of the light emitting stack 120 may be reduced and also the luminous efficiency may be improved.

FIG. 9A, FIG. 9B, FIG. 9C, FIG. 9D, FIG. 9E, FIG. 9F, FIG. 9G, and FIG. 9H are sectional side views for describing an order of processes for fabricating the light emitting package 100, according to some example embodiments.

Figure 9A:
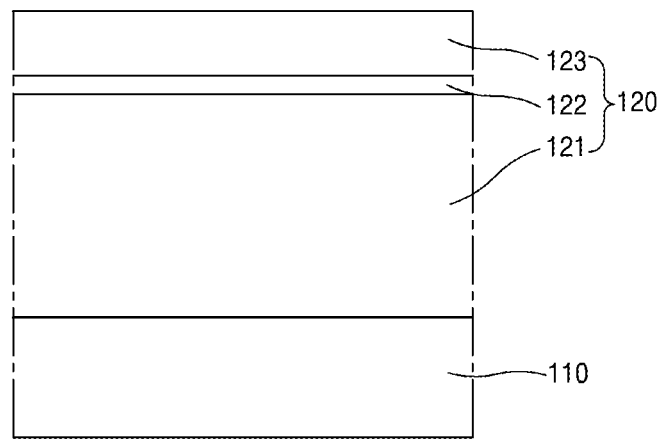
FIG. 9A, FIG. 9B, FIG. 9C, FIG. 9D, FIG. 9E, FIG. 9F, FIG. 9G, and FIG. 9H are sectional side views for describing an order of processes for fabricating a light emitting package, according to some example embodiments.

Referring to FIG. 9A, the light emitting stack 120 sequentially including the first conductivity type semiconductor layer 121, the active layer 122, and the second conductivity type semiconductor layer 123 may be formed on the substrate 110 as a wafer level.

The substrate 110 may be an insulating substrate, such as a sapphire substrate. However, the present inventive concepts are not limited thereto. In some example embodiments, the substrate 110 may be a conductive or a semiconductor substrate. In some example embodiments, the substrate 110 may include SiC, Si, MgAl$_2$O$_4$, MgO, LiAlO$_2$, LiGaO$_2$, GaN, etc.

Each of the first conductivity type semiconductor layer 121, the active layer 122, and the second conductivity type semiconductor layer 123 may be formed by using a chemical vapor deposition method, an atomic layer deposition method, etc. In some example embodiments, the first conductivity type semiconductor layer 121, the active layer 122, and the second conductivity type semiconductor layer 123 may be formed by using a metalorganic chemical vapor deposition (MOCVD) method.

Figure 9B:
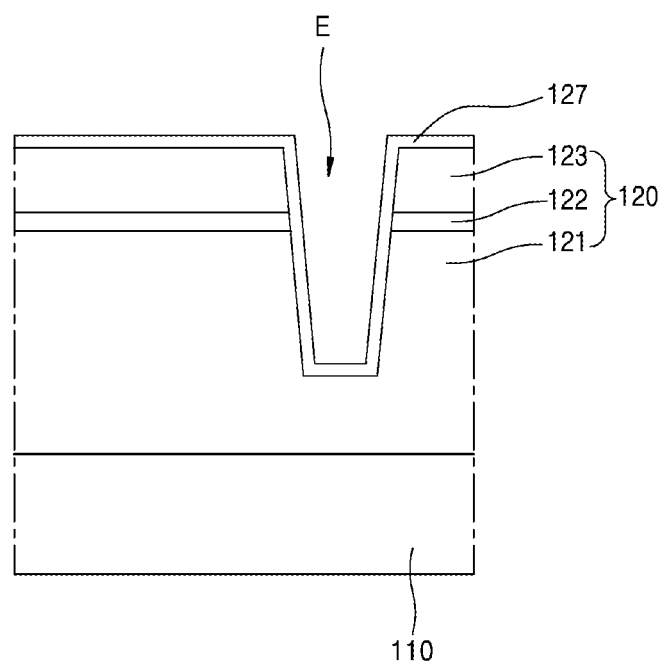

Referring to FIG. 9B, the opening E may be formed to penetrate the second conductivity type semiconductor layer 123 and the active layer 122 of the light emitting stack 120 and expose a portion of the first conductivity type semiconductor layer 121. The opening E may be formed by using a mesa etch method.

Thereafter, the first insulating layer 127 is formed at an internal surface of the opening E and a surface of the second conductivity type semiconductor layer 123. The first insulating layer 127 may include silicon oxide, silicon nitride, or silicon oxynitride, but is not limited thereto. Also, although FIG. 9B illustrates that one opening E is formed, two or more openings E may be formed.

Figure 9C:
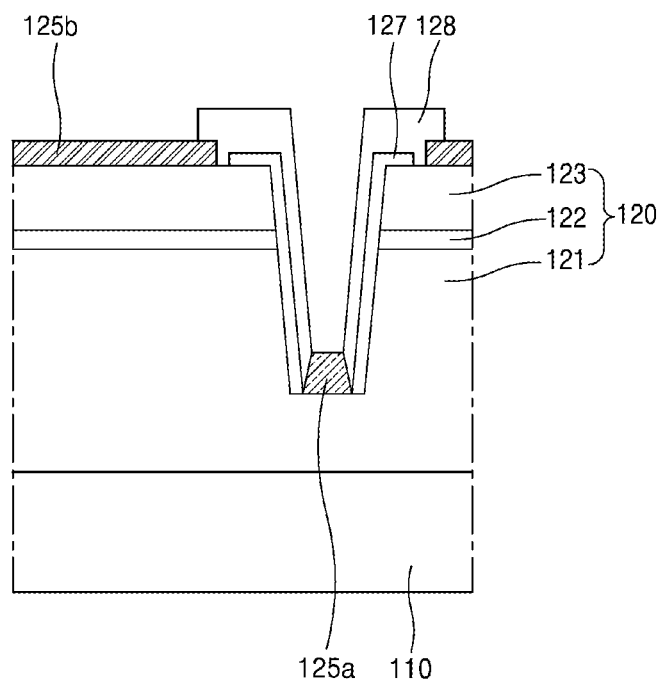

Referring to FIG. 9C, the first contact 125a and the second contact 125b including conductive ohmic materials may be deposited on a removed portion of the first insulating layer 127. The first contact 125a may be deposited above the first conductivity type semiconductor layer 121 to electrically contact the first conductivity type semiconductor layer 121. Also, the second contact 125b may be deposited above the second conductivity type semiconductor layer 123 to electrically contact the second conductivity type semiconductor layer 123.

Thereafter, the second insulating layer 128 may be formed between the first contact 125a and the second contact 125b to electrically insulate the first contact 125a and the second contact 125b from each other.

The first contact 125a and the second contact 125b may include a reflective material layer including any one of Ag, Al, Ni, Cr, Cu, Au, Pd, Pt, Sn, W, Rh, Ir, Ru, Mg, Zn, and an alloy thereof.

Figure 9D:
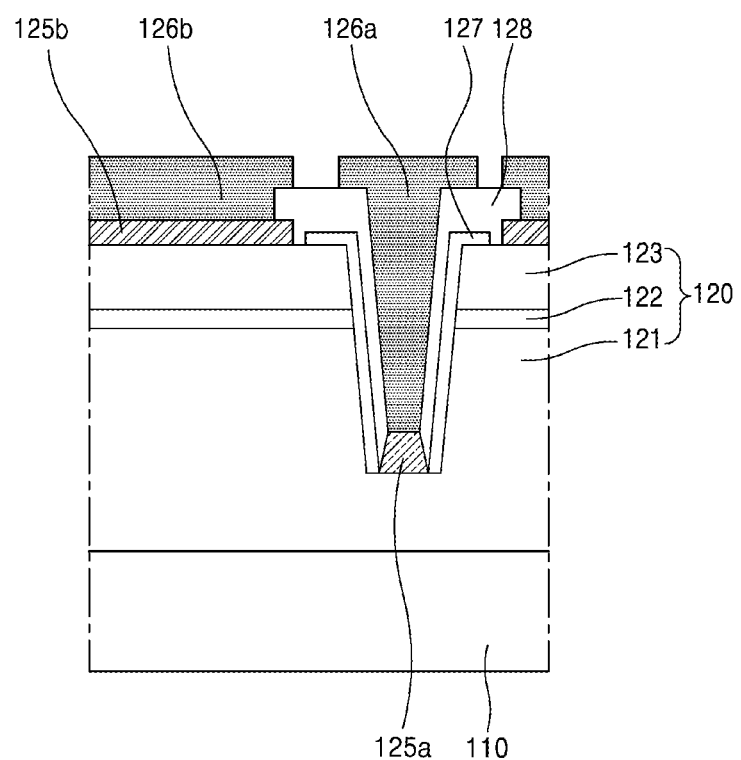

Referring to FIG. 9D, the first connectivity unit 126a and the second connectivity unit 126b may be electrically connected to the first contact 125a and the second contact 125b, respectively.

Figure 9E:
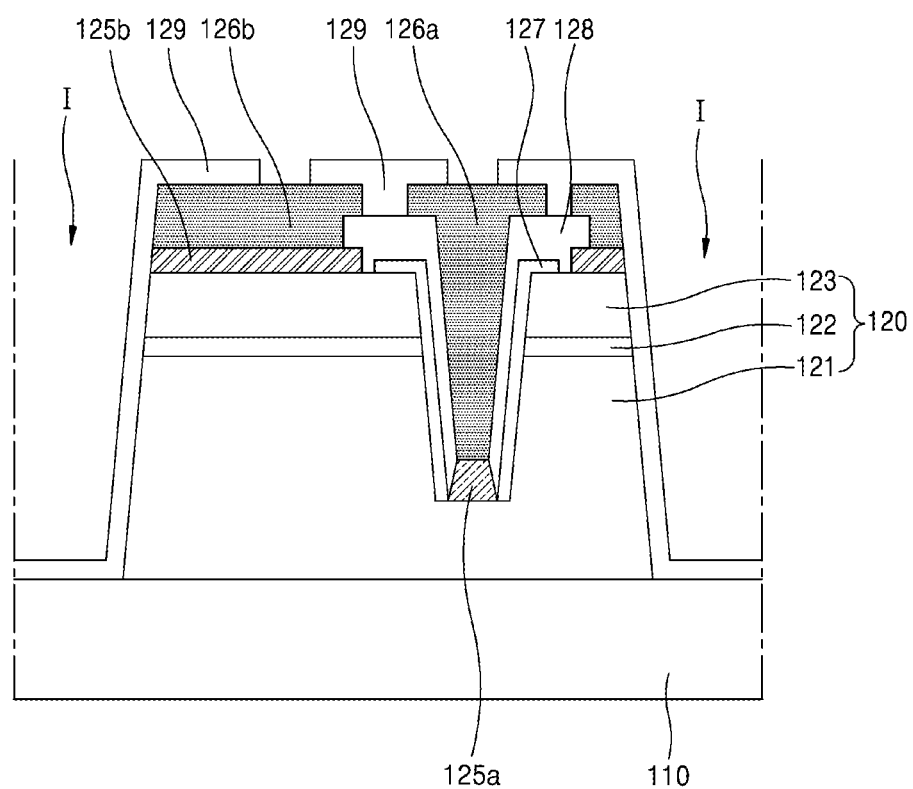

Referring to FIG. 9E, an isolation I may be formed to separate the light emitting stacks 120. Also, the isolation I may be formed to penetrate the second connectivity unit 126b, the second contact 125b, and the light emitting stack 120, except the substrate 110. The isolation process may be performed by using a blade. However, it is not limited thereto. The light emitting stacks 120 may be cut by certain methods without cutting the substrate 110. Via the isolation process, the light emitting stacks 120 are separated into separate chips and supported by the substrate 110. A sectional plane of the light emitting stack 120 that is generated by the isolation process may have a ladder shape having an upper portion having a smaller width than a lower portion, and thus, a sloped surface may be formed at a side surface of the light emitting stack 120.

Next, the third insulating layer 129 may be formed on the slope surface of the light emitting stack 120, the first connectivity unit 126a, the second connectivity unit 126b, and the second insulating layer 128. Then, the first connectivity unit 126a and the second connectivity unit 126b may be partially exposed. The third insulating layer 129 may serve as a passivation layer together with the first insulating layer 127 and the second insulating layer 128 remaining after being formed in the previous process.

Figure 9F:
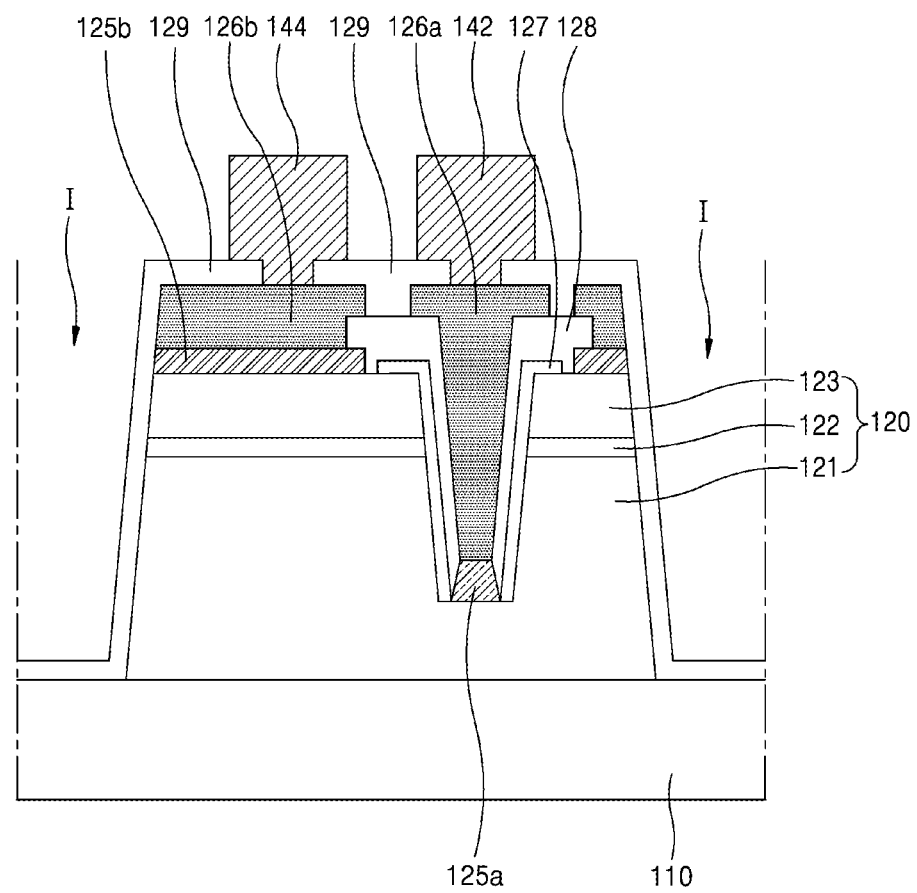

Referring to FIG. 9F, the first metal post 142 and the second metal post 144 may be formed at partially exposed portions of the first connectivity unit 126a and the second connectivity unit 126b. Each of the first metal post 142 and the second metal post 144 may be formed by Cu, but it is not limited thereto. The first metal post 142 and the second metal post 144 may be formed by using a certain conductive material.

Figure 9G:
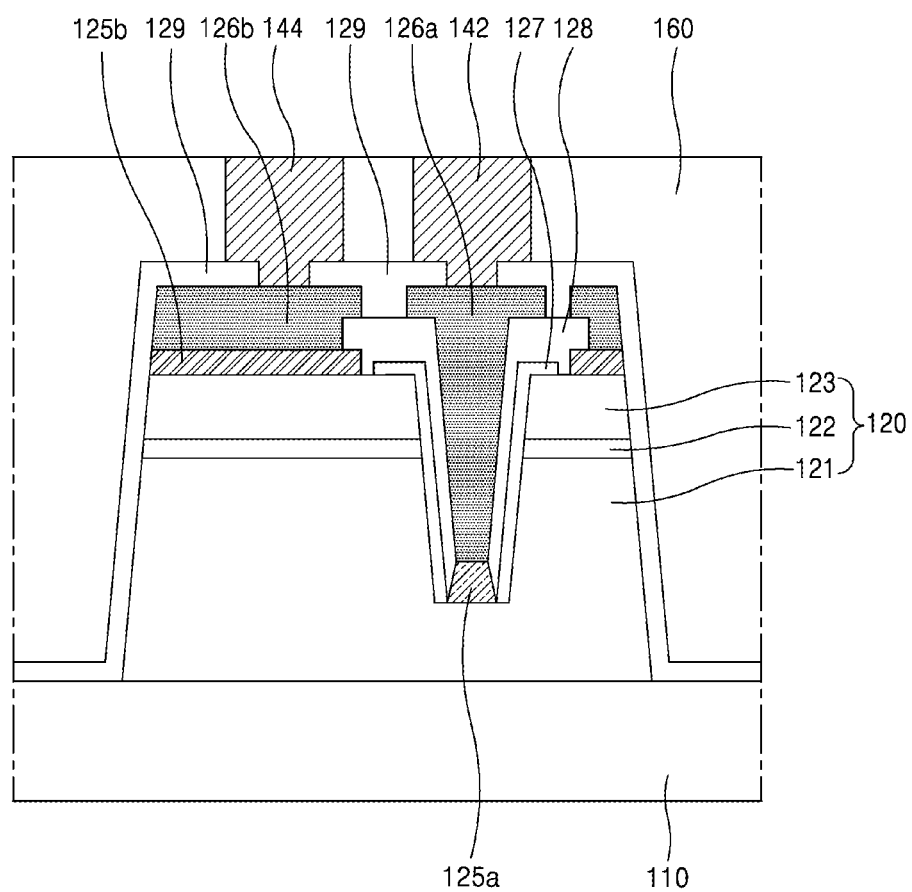

Referring to FIG. 9G, the encapsulation unit 160 may be formed to bury the first metal post 142, the second metal post 144, and the light emitting stack 120. The encapsulation unit 160 may be formed to expose upper surfaces of the first metal post 142 and the second metal post 144.

The encapsulation unit 160 may have a Young's modulus that is appropriately high to support the light emitting package 100. Also, the encapsulation unit 160 may be selected to have a heat conductivity that is appropriate to emit heat generated in the light emitting stack 120. Also, the encapsulation unit 160 may have a greater CTE than an overall CTE of the light emitting stack 120, as described above. In particular, the encapsulation unit 160 may have the greater CTE than the overall CTE of the light emitting stack 120 in a temperature range of about 50° C. to about 110° C. For example, the encapsulation unit 160 may have a CTE of about 10 ppm/K to about 100 ppm/K in a temperature range of about 50° C. to about 110° C.

Further, the encapsulation unit 160 may further include a light reflection material for reflecting light emitted from the light emitting stack 120. The light reflection material may include TiO$_2$, Al$_2$O$_3$, etc. However, the present inventive concepts are not limited thereto.

A process of forming the encapsulation unit 160 may include spreading an encapsulation member to cover upper portions of the first metal post 142 and the second metal post 144, and exposing the upper portions of the first metal post 142 and the second metal post 144 by using a planarization process, such as grinding.

Figure 9H:
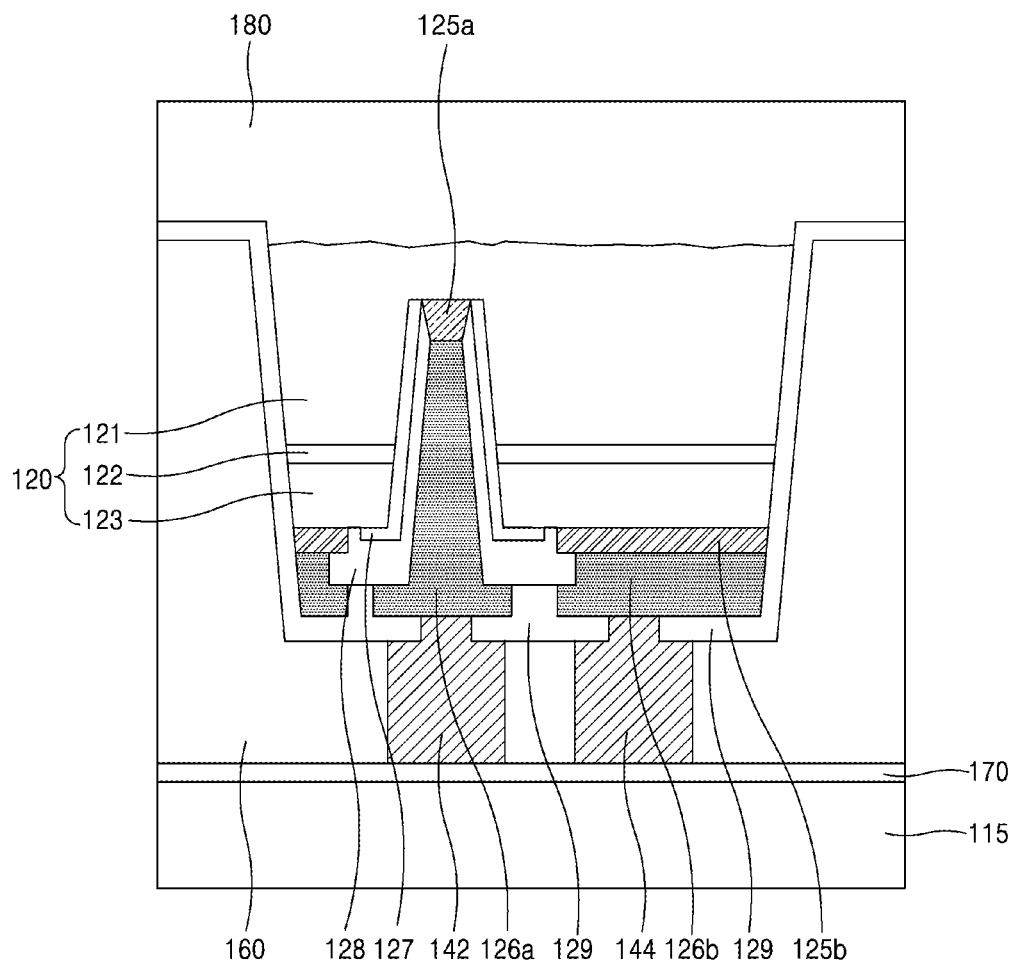

Referring to FIG. 9H, a bonding layer 170 may be interposed on a surface that is opposite to a surface on which the substrate 110 (refer to FIG. 9G) is bonded, so that a supporting substrate 115 may be bonded. The bonding layer 170 may include, for example, an ultraviolet (UV) curable material. Thereafter, the substrate 110 (refer to FIG. 9G) may be removed via grinding, laser lift-off, etc. Here, an upper surface of the first conductivity type semiconductor layer 121 may be textured and roughened to increase light extraction efficiency.

Thereafter, the transparent wavelength conversion layer 180 including a phosphor may be formed on the light emitting stack 120. Also, various optical structures, such as an optical lens, may be added, as needed. Then, the bonding layer 170 and the supporting substrate 115 may be removed and a process of cutting the light emitting package 100 into separate packages may be performed. For example, after the bonding layer 170 and the supporting substrate 115 are removed, an adhesive type may be bonded and the light emitting package may be separated into separate packages via blade cutting.

A chip scale package (CSP) obtained via the above described process may be realized as a package having substantially the same size as a semiconductor light emitting device (that is, an LED chip), and thus, the CSP may obtain a large amount of light per unit area. Also, all processes are performed as a wafer level, a large amount of production is possible, and the LED chip and the optical structures, such as the wavelength conversion layer and the lens, may be integrally fabricated.

Figure 10:
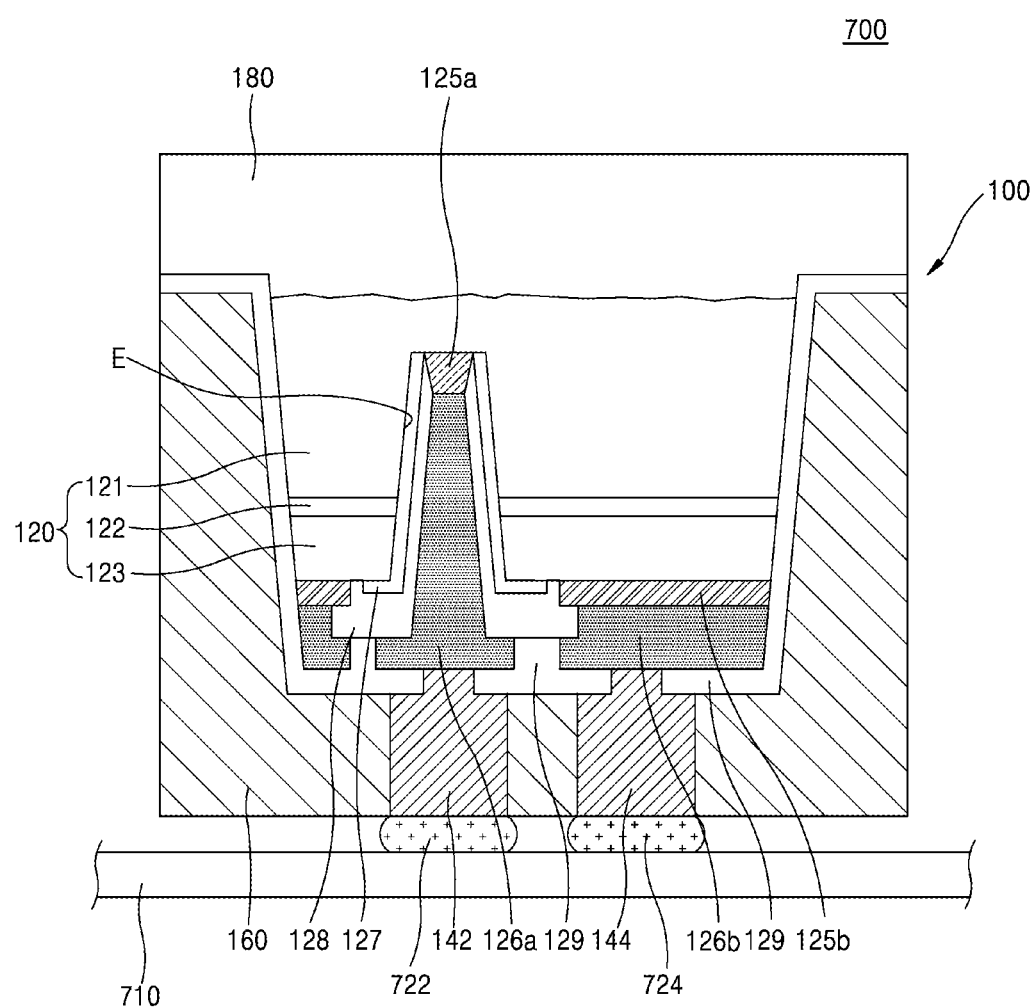
FIG. 10 is a sectional side view of a light emitting module according to some example embodiments.

FIG. 10 is a sectional side view of a light emitting module 700 according to some example embodiments.

Referring to FIG. 10, the light emitting package 100 may be mounted on a module substrate 710. The light emitting package 100 is described with reference to FIG. 1, and thus, it will not be additionally described.

The module substrate 710 may include certain substrates, on which the light emitting package 100 may be mounted, and is not limited to a particular substrate. In some example embodiments, the module substrate 710 may be a printed circuit board (PCB). In some example embodiments, the module substrate 710 may be a flexible PCB (FPCB).

The light emitting package 100 may be mounted on the module substrate 710 with solder bumps 722 and 724 interposed therebetween. However, devices for electrically and physically connecting the light emitting package 100 to the module substrate 710 are not limited to the solder bumps 722 and 724.

The solder bumps 722 and 724 may be coupled to the first metal post 142 and the second metal post 144, respectively. Also, the solder bumps 722 and 724 may be coupled to contact terminals, respectively, which are provided on the module substrate 710.

In FIG. 10, it is described that the light emitting package 100 of FIG. 1 is mounted. However, other light emitting packages 200, 300, 400, 500, and 600 described with reference to FIGS. 2, 3, and 6-8 may also be mounted.

Also, in FIG. 10, it is described that one light emitting package 100 is mounted on the module substrate 710. However, two or more light emitting packages may be mounted on the module substrate 710. Also, two or more light emitting packages mounted on one module substrate 710 may be homogeneous light emitting packages or heterogeneous light emitting packages.

When the module substrate 710 is a FPCB, a generally flexible light emitting module 700 may be obtained if a material having a low Young's modulus is selected to be included in the encapsulation layer 160 of the light emitting package 100. The flexible light emitting module 700 may be appropriately applied to a wearable device.

In some example embodiments, the module substrate 710 may have a greater CTE than the encapsulation layer 160 and a compound semiconductor of $Al_xIn_yGa_zN$ (0≤x≤1, 0≤y≤1, 0≤z≤1, x+y+z=1). In this case, a length change of the module substrate 710 in a horizontal direction is greater than a length change of the light emitting package 100 in a horizontal direction, since a temperature of the module substrate 710 increases due to the light emission of the light emitting package 100. Thus, tensile stress may be transmitted to the light emitting package 100. When the tensile stress is transmitted to the light emitting stack 120, the luminous efficiency may be improved.

Figure 11A:
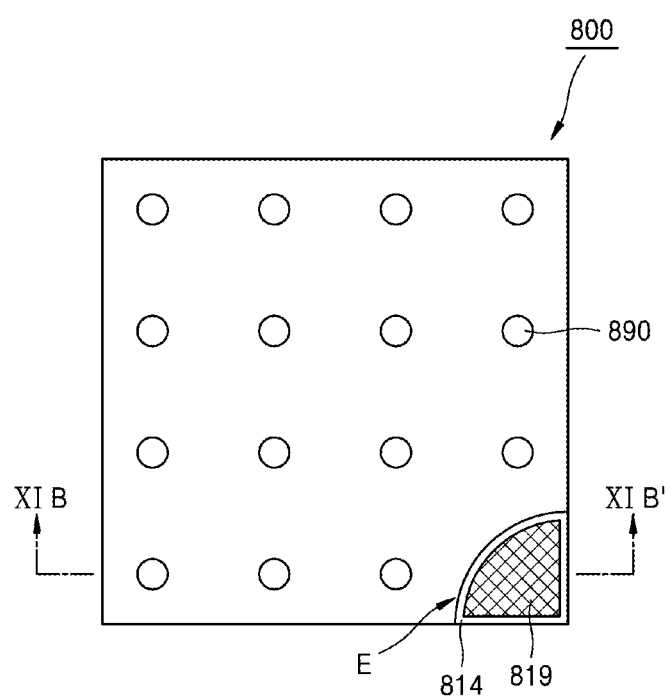
FIG. 11A is a plan view of an example of a semiconductor light emitting device according to some example embodiments.
Figure 11B:
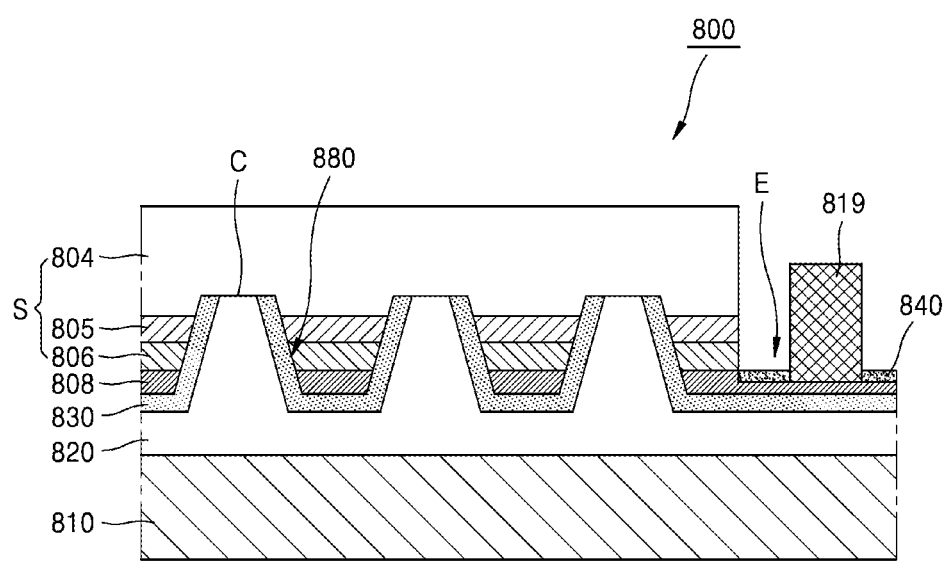
FIG. 11B is a sectional side view taken along a line XIB-XIB' of the semiconductor light emitting device of FIG. 11A.

FIG. 11A is a plan view of an example of a semiconductor light emitting device 800 according to some example embodiments, and FIG. 11B is a sectional side view of the semiconductor light emitting device 800 of FIG. 11A, taken along a line XIB-XIB' in FIG. 11A.

The semiconductor light emitting device 800 shown in FIGS. 11A and 11B may have a large area structure for high power for use of illumination. The semiconductor light emitting device 800 has a structure for improving a current dispersion efficiency and a heat dissipation efficiency.

The semiconductor light emitting device 800 includes a light emitting stack S, a first electrode layer 820, an insulating layer 830, a second electrode layer 808, and a substrate 810. The light emitting stack S includes a first conductivity type semiconductor layer 804, an active layer 805, and a second conductivity type semiconductor layer 806, which are sequentially stacked. In addition, the light emitting stack S may be fabricated using a chemical vapor phase deposition apparatus.

The first electrode layer 820 may include one or more contact holes 880, which extend to at least a portion of the first conductivity type semiconductor layer 804 while electrically insulated from the second conductivity type semiconductor layer 806 and the active layer 805, in order to be electrically connected to the first conductivity type semiconductor layer 804. The contact hole 880 may extend from an interface of the first electrode layer 820 to an inside of the first conductivity type semiconductor layer 804 through the second electrode layer 808, the second conductivity type semiconductor layer 806, and the active layer 805. The contact hole 880 may be formed using an etching process, for example, ICP-RIE or the like.

The insulating layer 830 for electrically insulating the first electrode layer 820 from other regions excluding the substrate 810 and the first conductivity type semiconductor layer 804 is formed on the first electrode layer 820. As shown in FIG. 11B, the insulating layer 830 is formed on a sidewall of the contact hole 880 as well as between the first electrode layer 820 and the second electrode layer 808. Thus, the first electrode layer 820 may be insulated from the second electrode layer 808, the second conductivity type semiconductor layer 806, and the active layer 805, which are exposed on the sidewall of the contact hole 880. The insulating layer 830 may be formed by depositing an insulating material such as $SiO_2$, $SiO_xN_y$, or $Si_xN_y$.

A contact region C of the first conductivity type semiconductor layer 804 is exposed by the contact hole 880, and a portion of the first electrode layer 820 may contact the contact region C through the contact hole 880. Thus, the first electrode layer 820 may be connected to the first conductivity type semiconductor layer 804.

The contact hole 880 may be appropriately adjusted to reduce a contact resistance in terms of a number, a shape, a pitch, contact diameters (or contact areas) with the first and second conductivity type semiconductor layers 304, 306, or the like (see FIG. 11A). In addition, the contact holes 880 may be arranged in various configurations of rows and columns, thereby improving current flow. The number and contact areas of conductive vias may be adjusted such that the area of the contact region C ranges from about 0.1% to about 20% of the planar area of the light emitting stack S. For example, the area of the contact region C ranges from about 0.5% to about 15%, specifically, from about 1% to about 10% of the planar area of the light emitting stack S. If the area of the contact region C is less than 0.1% of the planar area of the light emitting stack S, luminescent properties of the semiconductor light emitting device 800 are deteriorated due to non-uniform current dispersion, and if the area of the contact region C is increased to 20% or more of the planar area of the light emitting stack S, luminescent properties and brightness of the semiconductor light emitting device 800 may be deteriorated due to relative reduction in light emitting area.

A radius of a region of the conductive via, which is in contact with the first conductivity type semiconductor layer 804, may range, for example, from about 1 µm to about 50 µm, and the number of conductive vias may range from about 1 to about 48000 per light emitting stack region, depending upon the area of the light emitting stack region. Although varying with the area of the light emitting stack region, the number of conductive vias may range, for example, from about 2 to about 45000, specifically from about 5 to about 40000, more specifically from about 10 to about 35000 per a semiconductor light emitting device 800. The conductive vias may form a matrix structure of rows and columns, and in this case, a distance between the conductive vias may range from about 10 µm to about 1000 µm, for example, from about 50 µm to about 700 µm, specifically from about 100 µm to about 500 µm, more specifically from about 150 µm to about 400 µm.

If the distance between the conductive vias is less than about 10 µm, since the number of conductive vias is increased, and the light emitting area is relatively reduced, a luminous efficiency of the semiconductor light emitting device 800 is deteriorated. In addition, if the distance between the conductive vias is greater than about 1000 µm, the luminous efficiency may be deteriorated due to difficult current diffusion. A depth of the conductive via may vary with thicknesses of the second conductivity type semiconductor layer 806 and the active layer, and may range, for example, from about 0.1 µm to about 5.0 µm.

The second electrode layer 808 extends to an outside of the light emitting stack S to provide an exposed electrode forming region E, as shown in FIG. 11B. The electrode forming region E may include an electrode pad 819 for connecting the second electrode layer 808 to an external power supply. Although one electrode forming region E is shown in FIG. 11A, the semiconductor light emitting device 800 may include a plurality of electrode forming regions E, as needed. The electrode forming region E may be formed in a corner of the semiconductor light emitting device 800 in order to increase (and/or maximize) the light emitting area, as shown in FIG. 11A.

In some example embodiments, an etch-stop-purpose insulating layer 840 may be arranged around the electrode pad 819. The etch-stop-purpose insulating layer 840 may be formed in the electrode forming region E after the light emitting stack S is formed and before the second electrode layer 808 is formed, and may act as an etch stop layer when an etching process for forming the electrode forming region E is performed.

The second electrode layer 808 may include a material which has high reflectivity while forming ohmic contact to the second conductivity type semiconductor layer 806. The second electrode 808 may include a reflective electrode material.

The substrate 810 may have a greater CTE than the light emitting stack S. In particular, the substrate 810 may have the greater CTE than the light emitting stack S in a temperature range of about 50° C. to about 110° C.

The substrate 810 may have a CTE of about 10 ppm/K to about 100 ppm/K in a temperature range of about 50° C. to about 110° C. If the CTE is too small, tensile stress as described later may not be applied to the light emitting stack S, and thus, the luminous efficiency of the light emitting device 800 may deteriorate, and thermal droop may not be reduced.

If the CTE of the substrate 810 is too big, cracks may occur between the substrate 810 and the first electrode layer 820.

The substrate 810 may include a polymer material or a conductive metal.

When the substrate 810 includes a polymer material, and a glass transition temperature (Tg) thereof is relatively low, the substrate 810 may have a relatively greater CTE. In particular, when the glass transition temperature (Tg) of the substrate 810 is lower than a general operation temperature of the light emitting device 800, the substrate 810 may have a relatively great CTE. The substrate 810 may have a glass transition temperature (Tg) that is equal to or less than about 60° C. For example, the substrate 810 may have a CTE of about 65 ppm/K to about 95 ppm/K in a temperature range of a temperature between about 50° C. and about 110° C.

The substrate 810 may include, for example, a silicone resin, a W-silicone resin, a W-LMC, etc. In some example embodiments, metal particles or metal oxide particles for improving optical reflectance may be mixed in the substrate 810.

When the temperature of the substrate 810 increases, the substrate 810 expands in a side direction and tensile stress generated due thereto may be indirectly transmitted to the light emitting stack S through the first electrode layer 820 and the insulating layer 830. Due to the transmitted tensile stress, the IQE of the light emitting stack S may be improved as described above. Thus, thermal droop of the light emitting stack S may be reduced and also the luminous efficiency may be improved.

Figure 12:
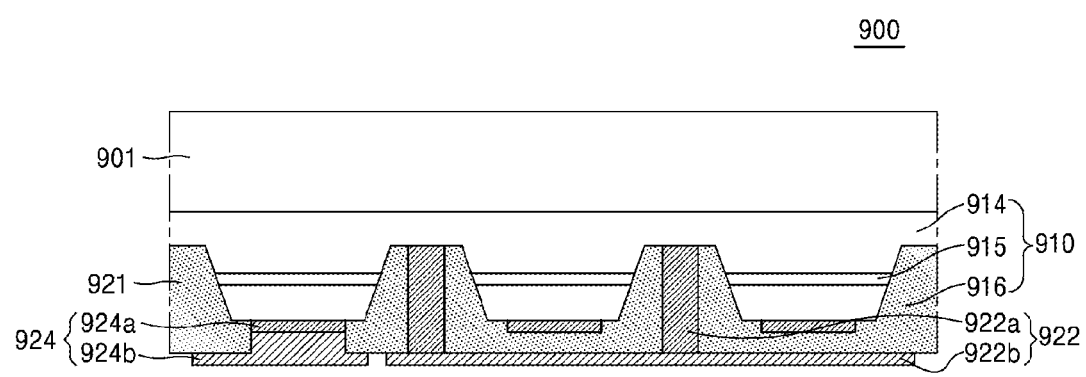
FIG. 12 is a sectional side view of a semiconductor light emitting device according to some example embodiments.

FIG. 12 is a sectional side view of a semiconductor light emitting device 900 according to some example embodiments.

Referring to FIG. 12, the semiconductor light emitting device 900 includes a light emitting stack 910 formed on a substrate 910. The light emitting stack 910 may include a first conductivity type semiconductor layer 914, an active layer 915, and a second conductivity type semiconductor layer 916.

The semiconductor light emitting device 900 includes a first electrode 922 and a second electrode 924 contacting the first conductivity type semiconductor layer 914 and the second conductivity type semiconductor layer 916, respectively. The first electrode 922 may include a connection electrode unit 922a, such as a conductive via, which penetrates the second conductivity type semiconductor layer 916 and the active layer 915 and contacts the first conductivity type semiconductor layer 914, and a first electrode pad 922b connected to the connection electrode unit 922a. The connection electrode unit 922a may be surrounded by an insulating layer 921 and may be electrically insulated from the active layer 915 and the second conductivity type semiconductor layer 916. The connection electrode unit 922a may be disposed in an etched area of the light emitting stack 910. The connection electrode unit 922a may be appropriately adjusted to reduce a contact resistance in terms of a number, a shape, a pitch, a contact area with the first conductivity type semiconductor layers 914, or the like. In addition, the connection electrode unit 922a may be arranged on the light emitting stack S to form rows and columns, thereby improving current flow. Also, the second electrode 924 may include an ohmic contact layer 924a on the second conductivity type semiconductor layer 916 and the second electrode pad 924b.

Each of the connection electrode unit 922a and the ohmic contact 924a may include a single-layer or multi-layer structure, which includes the first and second conductivity type semiconductor layers 914 and 916 and a conductive material having an ohmic property. For example, the connection electrode unit 922a and the ohmic contact 924a may be formed by depositing or sputtering at least one of materials, such as Ag, Al, Ni, Cr, and transparent conductive oxide (TCO).

The first and second electrode pads 922b and 924b may contact the connection electrode unit 922a and the ohmic contact 924a, respectively, and function as external terminals of the semiconductor light emitting device 900. For example, the first and second electrode pads 922b and 924b may include Au, Ag, Al, Ti, W, Cu, Sn, Ni, Pt, Cr, NiSn, TiW, AuSn, or a eutectic metal thereof.

The first and second electrodes 922 and 924 may be disposed in the same direction, and may be mounted on a lead frame, etc., for example, as a flip-chip shape.

Meanwhile, the first and second electrodes 922b and 924b may be electrically insulated from each other via the insulating unit 921. The insulating unit 921 may include any material having an electrically insulating property. However, although the insulating unit 921 may include any material having an electrically insulating property, the insulating unit 921 may include a material having a low light absorption rate. For example, the insulating unit 921 may include silicon oxide or silicon nitride, such as $SiO_2$, $SiO_xN_y$, $Si_xN_y$, etc. According to necessity, a light reflection structure may be formed by dispersing a light reflective filler in a light transmittance material. Unlike this, the insulating unit 921 may have a multi-layer reflection structure in which a plurality of insulating layers having different reflex indices are alternately stacked. For example, the multi-layer reflection structure may be a distributed bragg reflector (DBR) in which a first insulating layer having a first refractive index and a second insulating layer having a second refractive index are alternately stacked.

The multi-layer reflection structure may include a plurality of insulating layers having different reflex indices, which are twice to one hundred times repeatedly stacked. For example, the plurality of insulating layers may be thrice to seventy times repeatedly stacked, further, four times to fifty times repeatedly stacked. Each of the plurality of insulating layers of the multi-layer reflection structure may include oxide, nitride, or a combination thereof, wherein oxide or nitride includes, for example, $SiO2$, SiN, $SiO_xN_y$, $TiO_2$, $Si_3N_4$, $Al_2O_3$, TiN, AlN, $ZrO_2$, TiAlN, TiSiN, etc. For example, when a wavelength of light generated in the active layer 915 is λ, and n is a refractive index of a corresponding layer, the first insulating layer and the second insulating layer may be formed to have a thickness of $\lambda/n$, and may have a thickness of about 300 to 900 Å. In this case, the multi-layer reflection structure may be designed such that refractive indices and thicknesses of the first insulating layer and the second insulating layer are selected such that the first insulating layer and the second insulating layer have a high reflectance (equal to or greater than 95%) with respect to the wavelength of light generated in the active layer 915.

The refractive indices of the first insulating layer and the second insulating layer may be determined between about 1.4 and about 2.5, and may be less than a refractive index of the first conductivity type semiconductor layer 904 and a refractive index of the substrate 901. However, the refractive indices of the first insulating layer and the second insulating layer may be less than the refractive index of the first conductivity type semiconductor layer 904 and greater than the refractive index of the substrate 901.

The substrate 901 may have a greater CTE than the light emitting stack 910. In particular, the substrate 901 may have a CTE that is greater than an overall CTE of the light emitting stack 910 in a temperature range of about 50° C. to about 110° C.

The substrate 901 may have a CTE of about 10 ppm/K to about 100 ppm/K in a temperature range of about 50° C. to about 110° C. If the CTE is too small, tensile stress as described later may not be applied to the light emitting stack 910, and thus, the luminous efficiency of the light emitting device 900 may deteriorate, and thermal droop may not be reduced.

If the CTE of the substrate 901 is too big, cracks may occur between the substrate 901 and the first conductivity type semiconductor layer 914.

The substrate 901 may include a polymer material or a conductive metal.

When the substrate 901 includes a polymer material, and a glass transition temperature (Tg) thereof is relatively low, the substrate 901 may have a relatively greater CTE. In particular, when the glass transition temperature (Tg) of the substrate 901 is lower than a general operation temperature of the light emitting device 900, the substrate 901 may have a relatively great CTE. The substrate 901 may have a glass transition temperature (Tg) that is equal to or less than about 60° C. For example, the substrate 910 may have a CTE of about 65 ppm/K to about 95 ppm/K at a temperature between about 50° C. and about 110° C.

The substrate 901 may include, for example, a silicone resin.

When the temperature of the substrate 901 increases, the substrate 901 expands in a side direction and tensile stress generated due thereto may be transmitted to the light emitting stack 910. Due to the transmitted tensile stress, the IQE of the light emitting stack 910 may be improved as described above. Thus, thermal droop of the light emitting stack 910 may be reduced and also the luminous efficiency may be improved.

Hereinafter, structures and effects of the present inventive concepts are described in more detail with reference to specific experimental examples and a comparative example.

Figure 13A:
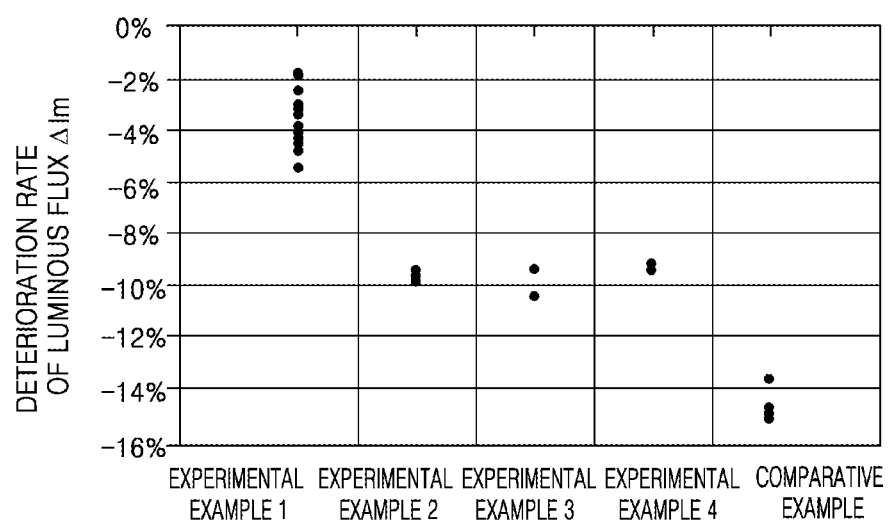
FIG. 13A and FIG. 13B are graphs showing results of measuring a luminous flux change rate and an efficiency deterioration rate with respect to chip scale package (CSP) light emitting packages fabricated according to some example embodiments.
Figure 13B:
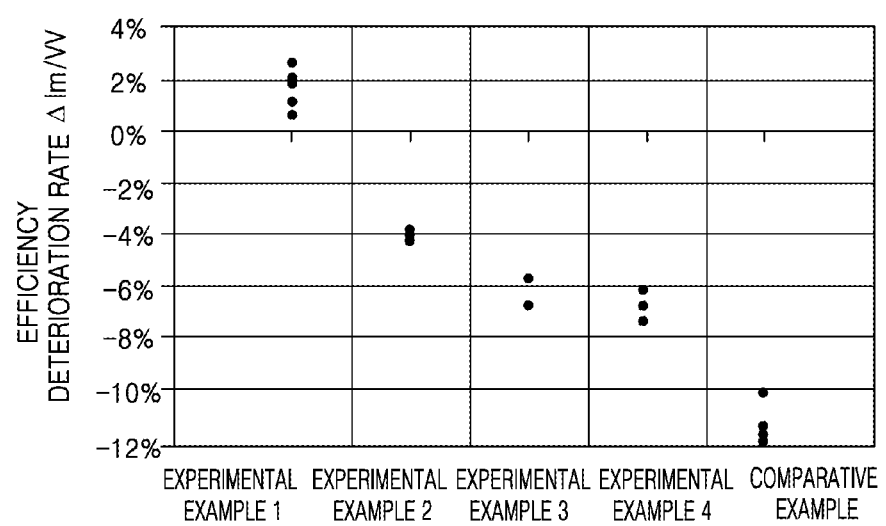

FIG. 13A and FIG. 13B are graphs showing results of measuring a luminous flux change rate and an efficiency deterioration rate with respect to chip scale package (CSP) light emitting packages fabricated according to experimental examples 1 through 4 and a comparative example. However, the experimental examples are presented to fully convey the present inventive concepts and do not limit the scope of the present inventive concepts.

Experimental Example 1

A CSP light emitting package having the structure illustrated in FIG. 1 is fabricated. A W-silicone resin is used as an encapsulation layer.

Experimental Example 2

A CSP light emitting package having the structure illustrated in FIG. 1 is fabricated. A W-LMC resin is used as an encapsulation layer.

Experimental Example 3

A CSP light emitting package having the structure illustrated in FIG. 1 is fabricated. A silicone resin is used as an encapsulation layer.

Experimental Example 4

A CSP light emitting package having the structure illustrated in FIG. 1 is fabricated. A W-LMC resin is used as a portion of an encapsulation layer.

Comparative Example

A CSP light emitting package having the structure illustrated in FIG. 1 is fabricated. An LMC resin is used as an encapsulation layer and a wavelength conversion layer.

With respect to each of the fabricated CSP light emitting packages, a luminous flux change rate and an efficiency deterioration rate are measured at a temperature between 25° C. and 85° C., and the measured results are illustrated in FIGS. 13A and 13B.

Compared to the comparative example in which the LMC, which is previously widely used, is used as the encapsulation layer, in the experimental examples 1 through 4, in which the W-silicone resin, the W-LMC resin, and the silicone resin having greater CTEs than LMC are used, the luminous flux change rate and the efficiency deteriorate rate are improved. In particular, it is shown that when the W-silicone resin is used as the encapsulation layer, the efficiency is more greatly improved at 85° C. than at 25° C. In particular, in the case of the experimental example 1, the luminous flux deterioration rate is less than −5%, when the temperature increases from 25° C. to 85° C.

This difference is understood to be an effect of using the materials having greater CTEs than the LMC resin, as the encapsulation layer. Also, substantially the same effects are expected for the wavelength conversion layer using a material having a greater CTE than the LMC resin.

Figure 14A:
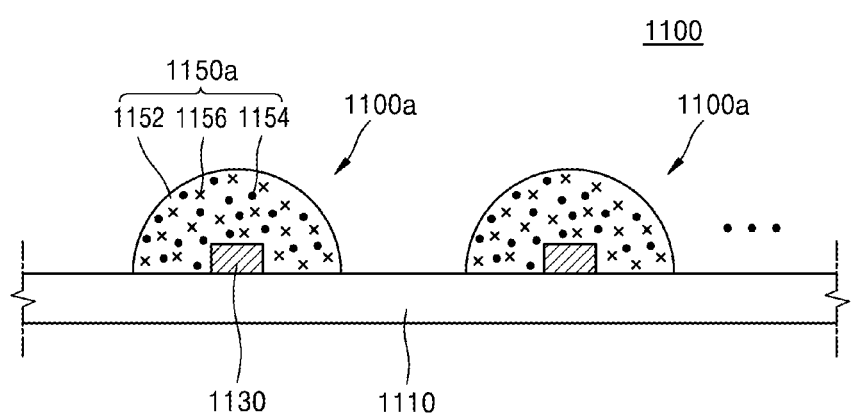
FIG. 14A and FIG. 14B are schematic cross-sectional views of white light source modules according to some example embodiments.
Figure 14B:
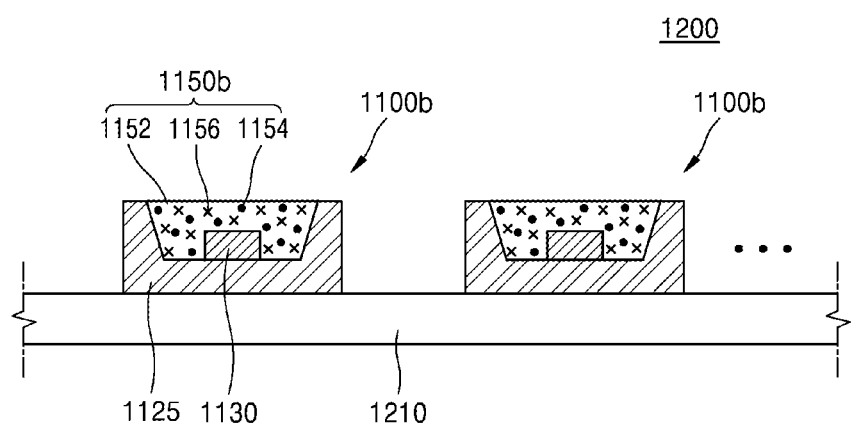

FIGS. 14A and 14B are schematic sectional views of white light source modules 1100 and 1200 according to some example embodiments.

Referring to FIG. 14A, the white light source module 1100 may include a circuit board 1110, and a plurality of white light emitting devices 1100a mounted on the circuit board 1110. A conductive pattern, which is connected to the white light emitting devices 1100a, may be formed on an upper surface of the circuit board 1110.

Each of the white light emitting devices 1100a may have a structure in which a light emitting device 1130 emitting blue light is directly mounted on the circuit board 1110 in a chip-on-board (COB) manner. Each of the white light emitting devices 1100a does not have a separate reflective wall. In addition, each of the white light emitting devices 1100a includes a wavelength converter 1150a having a semi-spherical shape to function as a lens, and thus may have a wide beam angle. Such a wide beam angle may contribute to reducing a thickness or width of an LCD display.

Referring to FIG. 14B, the white light source module 1200 may include a circuit board 1210, and a plurality of white light emitting devices 1100b mounted on the circuit board 1110. Each of the white light emitting devices 1100b may include a light emitting device 1130, which is mounted in a reflective cup of a package body 1125 and emits blue light, and a wavelength converter 1150b encapsulating the light emitting device 1130.

The light emitting device 1130 may be the light emitting packages 100 through 600 or the light emitting devices 800 and 900 described with reference to FIGS. 1 through 3, 6 through 8, and 10 through 12.

The wavelength converters 1150a, 1150b may contain a wavelength converting material such as a phosphor and/or a quantum dot, as needed.

Figure 15A:
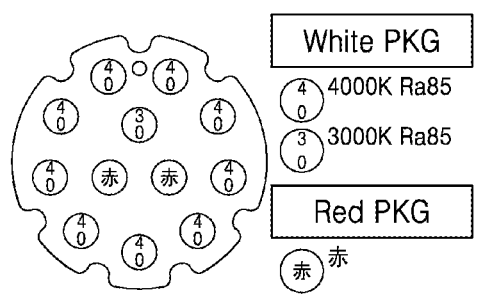
FIG. 15A and FIG. 15B show schematic diagrams of white light source modules applicable to an illumination device according to some example embodiments.
Figure 15B:
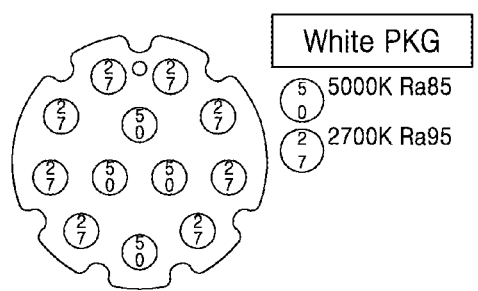

FIG. 15A and FIG. 15B show schematic diagrams of white light source modules applicable to an illumination device according to some example embodiments.

Each of the light source modules shown in FIGS. 15 (A) and 15 (B) may include a plurality of light emitting device packages mounted on a circuit board. The plurality of light emitting device packages mounted on one light source module may include homogeneous packages generating light of the same wavelengths, or alternatively, as in some example embodiments, may include heterogeneous packages generating light of different wavelengths.

Referring to FIG. 15A, the white light source module may include a combination of white light emitting device packages 40, 30 respectively having color temperatures of 4000K and 3000K and a red light emitting device package. The white light source module may be adjusted to a color temperature of 3000K to 4000K, and may provide white light having a color rendering index Ra of 85 to 100.

In another embodiment, the white light source module may include white light emitting device packages only, and some of the packages may emit white light different color temperatures. For example, as shown in FIG. 15B, a white light emitting device package 27 having a color temperature of 2700K and a white light emitting device package 50 having a color temperature of 5000K are combined, thereby providing white light which may be adjusted to a color temperature of 2700K to 5000K and has a color rendering index Ra of 85 to 99. Here, the number of light emitting device packages having each color temperature may mainly vary with basic set values of color temperatures. For example, in an illumination device having a basic set value of a color temperature of around 4000K, the number of packages corresponding to a color temperature of 4000K may be greater than the number of packages corresponding to a color temperature of 3000K, or the number of red light emitting device packages.

As such, a heterogeneous light emitting device package includes an light emitting device, which emits white light by combining a blue light emitting device with a yellow, green, red, or orange phosphor, and at least one of violet, blue, green, red, and infrared light emitting devices, thereby adjusting a color temperature and a color rendering index (CRI) of white light.

Figure 22:
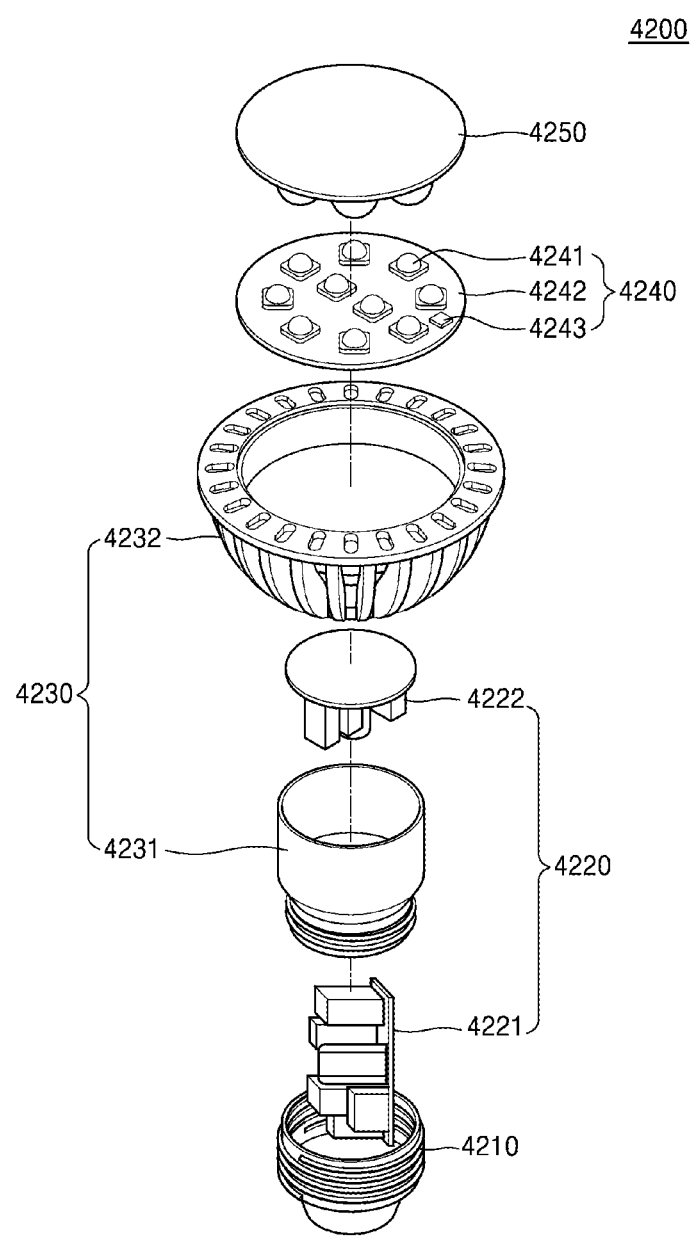
FIG. 22 is a schematic exploded perspective view showing a bulb type lamp as an illumination device according to some example embodiments.
Figure 24:
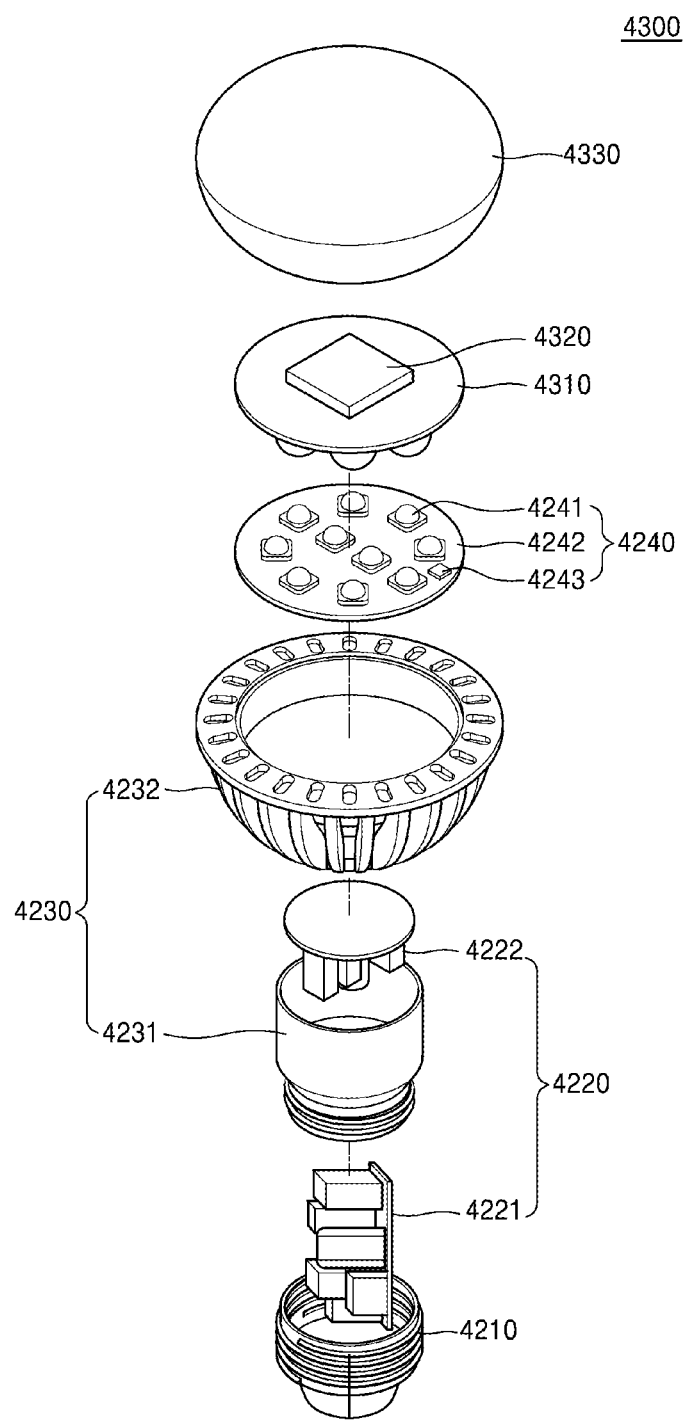
FIG. 24 is a schematic exploded perspective view showing a lamp, which includes a communication module, as an illumination device according to some example embodiments.

The white light source modules set forth above may be used as a light source module 4240 of a bulb type illumination device (4200 in FIG. 22 or 4300 in FIG. 24).

Figure 16:
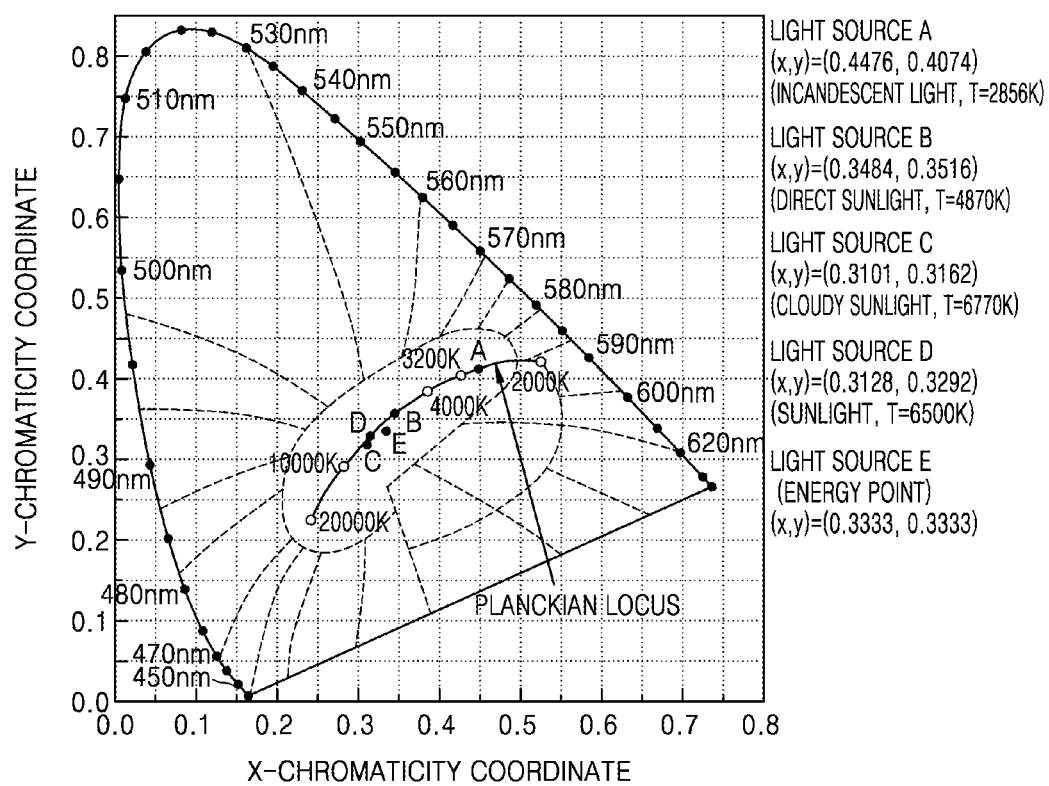
FIG. 16 shows an example of a color temperature spectrum of light emitted by a light emitting package or a semiconductor light emitting device according to some example embodiments.

FIG. 16 shows an example of a color temperature spectrum of light emitted by a light emitting package or a semiconductor light emitting device according to some example embodiments.

In a single light emitting device package, light of a desired color is determined based on a wavelength of an LED chip, which is a light emitting device, and a kind and a mixing proportion of a phosphor. In addition, in the case of white light, a color temperature and a color rendering index of the white light may be adjusted.

For example, when an LED chip emits blue light, a light emitting device package including at least one of yellow, green, and red phosphors may emit white light of various color temperatures according to a mixing proportion of a phosphor. Alternatively, a light emitting device package, in which a green or red phosphor is applied to a blue LED chip, may emit green or red light. As such, a light emitting device package emitting white light may be combined with a package emitting green or red light, thereby adjusting a color temperature and a color rendering index of white light. In addition, the light emitting device package may include at least one of light emitting devices emitting violet, blue, green, red, and infrared light.

In this case, an illumination device including the light emitting device package may be adjusted to a color rendering index of a sodium (Na) lamp level to a solar level. In addition, the illumination device may generate various white light having a color temperature of about 1500K to about 20000K, and if necessary, the illumination device may adjust an illumination color according to an ambient atmosphere or mood by generating visible light, which has a violet, blue, green, red, or orange color, or infrared light. Further, the illumination device may generate light of a special wavelength capable of promoting growth of plants.

White light obtained by combining a blue light emitting device with a yellow, green, or red phosphor and/or a green or red light emitting device may have two or more peak wavelengths, and may be positioned on a line segment defined by (x, y) coordinates of (0.4476, 0.4074), (0.3484, 0.3516), (0.3101, 0.3162), (0.3128, 0.3292), and (0.3333, 0.3333) in a CIE 1931 coordinate system, as shown in FIG. 16. Alternatively, the white light may be positioned in a region that is surrounded by the line segment and a black body radiation spectrum. A color temperature of the white light may range from 1500K to 20000K. In FIG. 16, white light around the coordinate E (0.3333, 0.3333) at a bottom portion of the black body radiation spectrum (planckian locus) may have a relatively low yellow-based property, and may be used as an illumination source of a region which may be more vivid and fresher to the naked eye. Thus, illumination products using the white light around the coordinate E (0.3333, 0.3333) at the bottom portion of the black body radiation spectrum (planckian locus) may be good for shopping mall illumination which sells groceries, clothing, etc.

Various materials such as a phosphor and/or a quantum dot may be used as a material for converting a wavelength of light emitted from a semiconductor light emitting device.

The phosphor may have the following empirical formulae and colors.

Oxide-based phosphor: Yellow and Green $Y_3Al_5O_{12}$:Ce, $Tb_3Al_5O_{12}$:Ce, $Lu_3Al_5O_{12}$: Ce Silicate-based phosphor: Yellow and Green $(Ba,Sr)_2SiO_4$: Eu, Yellow and Orange $(Ba,Sr)_3SiO_5$:Ce Nitride-based phosphor: Green β-SiAlON:Eu, Yellow $La_3Si_6N_{11}$:Ce, Orange α-SiAlON:Eu, Red $CaAlSiN_3$:Eu, $Sr_2Si_5N_8$:Eu, $SrSiAl_4N_7$:Eu, $SrLiAl_3N_4$:Eu, $Ln_{4-x}(Eu_zM_{1-z})_xSi_{12-y}Al_yO_{3+x+y}N_{18-x-y}$ ($0.5 \leq x \leq 3$, $0 < z < 0.3$, $0 < y \leq 4$)—Formula (1)

Here, in Formula (1), Ln may be at least one selected from the group consisting of Group IIIA elements and rare-earth elements, and M may be at least one selected from the group consisting of Ca, Ba, Sr, and Mg.

Fluoride-based phosphor: KSF-based Red $K_2SiF_6$:$Mn^{4+}$, $K_2TiF_6$:$Mn^{4+}$, $NaYF_4$:$Mn^{4+}$, $NaGdF_4$:$Mn^{4+}$, $K_3SiF_7$:$Mn^{4+}$.

Composition of the phosphor should accord with stoichiometry, and each element may be substituted with another element in a group of the periodic table, to which the element belongs. For example, Sr may be substituted with Ba, Ca, Mg, or the like of the alkali earth metal group (Group II), and Y may be substituted with Tb, Lu, Sc, Gd, or the like of the lanthanide series. In addition, Eu or the like, which is an activator, may be substituted with Ce, Tb, Pr, Er, Yb, or the like according to a desired energy level. Further, the activator may be used alone, or may be used in conjunction with a sub-activator or the like in order to modify properties of the phosphor.

In particular, the fluoride-based red phosphor may be coated with fluoride, which does not contain Mn, for improvement of reliability at high temperature/high humidity, or may further include an organic coating on a surface of the phosphor or on a fluoride coating surface not containing Mn. Since the fluoride-based red phosphor may realize a narrow full width at half maximum (FWHM) of 40 nm or less unlike other phosphors, the fluoride-based red phosphor may be used for high-resolution TVs such as UHD TVs.

Table 1 shows phosphors according to applications of white light emitting devices using LED chips (wavelength: 440 nm to 460 nm) or UV LED chips (wavelength: 380 nm to 440 nm)

TABLE 1

| Purpose | Phosphor |
| --- | --- |
| LED TV BLU | β-SiAlON:$Eu^{2+}$ |
| | (Ca, Sr)AlSiN$_3$:$Eu^{2+}$ |
| | La$_3$Si$_6$O$_{11}$:$Ce^{3+}$ |
| | K$_2$SiF$_6$:$Mn^{4+}$ |
| | K$_2$TiF$_6$:$Mn^{4+}$ |
| | NaYF$_4$:$Mn^{4+}$ |
| | NaGdF$_4$:$Mn^{4+}$ |
| | SrLiAl$_3$N$_4$:Eu |
| | Ln$_{4-x}$(Eu$_z$M$_{1-z}$)$_x$Si$_{12-y}$Al$_y$O$_{3+x+y}$N$_{18-x-y}$ |
| | ($0.5 \leq x \leq 3$, $0 < z < 0.3$, $0 < y \leq 4$) (1) |
| Illumination | Lu$_3$Al$_5$O$_{12}$:$Ce^{3+}$ |
| | Ca-α-SiAlON:$Eu^{2+}$ |
| | La$_3$Si$_6$N$_{11}$:$Ce^{3+}$ |
| | (Ca, Sr)AlSiN$_3$:$Eu^{2+}$ |
| | Y$_3$Al$_5$O$_{12}$:$Ce^{3+}$ |
| | K$_2$SiF$_6$:$Mn^{4+}$ |
| | K$_2$TiF$_6$:$Mn^{4+}$ |
| | NaYF$_4$:$Mn^{4+}$ |
| | NaGdF$_4$:$Mn^{4+}$ |
| | SrLiAl$_3$N$_4$:Eu |
| | Ln$_{4-x}$(Eu$_z$M$_{1-z}$)$_x$Si$_{12-y}$Al$_y$O$_{3+x+y}$N$_{18-x-y}$ |
| | ($0.5 \leq x \leq 3$, $0 < z < 0.3$, $0 < y \leq 4$) (1) |
| Side View (Mobile, Note PC) | Lu$_3$Al$_5$O$_{12}$:$Ce^{3+}$ |
| | Ca-α-SiAlON:$Eu^{2+}$ |
| | La$_3$Si$_6$N$_{11}$:$Ce^{3+}$ |
| | (Ca, Sr)AlSiN$_3$:$Eu^{2+}$ |
| | Y$_3$Al$_5$O$_{12}$:$Ce^{3+}$ |
| | (Sr, Ba, Ca, Mg)$_2$SiO$_4$:$Eu^{2+}$ |
| | K$_2$SiF$_6$:$Mn^{4+}$ |
| | K$_2$TiF$_6$:$Mn^{4+}$ |
| | NaYF$_4$:$Mn^{4+}$ |
| | NaGdF$_4$:$Mn^{4+}$ |
| | SrLiAl$_3$N$_4$:Eu |
| | Ln$_{4-x}$(Eu$_z$M$_{1-z}$)$_x$Si$_{12-y}$Al$_y$O$_{3+x+y}$N$_{18-x-y}$ |
| | ($0.5 \leq x \leq 3$, $0 < z < 0.3$, $0 < y \leq 4$) (1) |
| Electronics | Lu$_3$Al$_5$O$_{12}$:$Ce^{3+}$ |
| | Ca-α-SiAlON:$Eu^{2+}$ |
| | La$_3$Si$_6$N$_{11}$:$Ce^{3+}$ |
| | (Ca, Sr)AlSiN$_3$:$Eu^{2+}$ |
| | Y$_3$Al$_5$O$_{12}$:$Ce^{3+}$ |
| | K$_2$SiF$_6$:$Mn^{4+}$ |
| | K$_2$TiF$_6$:$Mn^{4+}$ |
| | NaYF$_4$:$Mn^{4+}$ |
| | NaGdF$_4$:$Mn^{4+}$ |
| | SrLiAl$_3$N$_4$:Eu |
| | Ln$_{4-x}$(Eu$_z$M$_{1-z}$)$_x$Si$_{12-y}$Al$_y$O$_{3+x+y}$N$_{18-x-y}$ |
| | ($0.5 \leq x \leq 3$, $0 < z < 0.3$, $0 < y \leq 4$) (1) |

In addition, wavelength converting materials such as a quantum dot (QD) may be used as the wavelength converter instead of or in conjunction with the phosphor.

Figure 17:
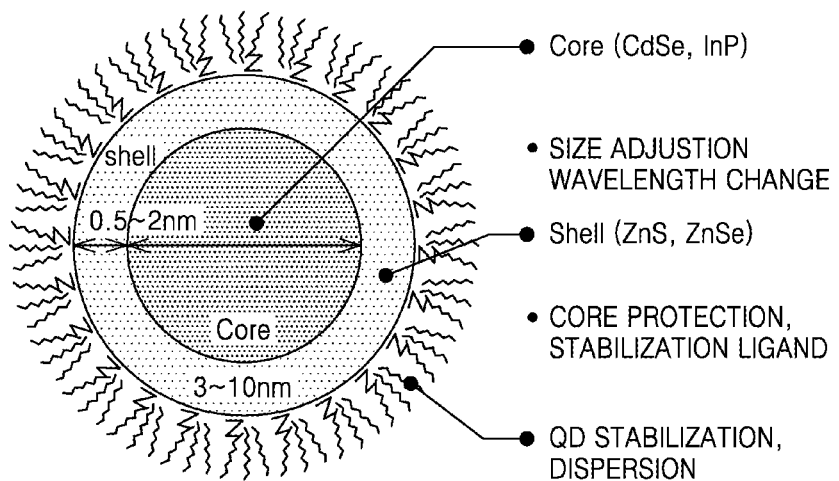
FIG. 17 is a schematic diagram showing a sectional structure of a quantum dot (QD) according to some example embodiments.

FIG. 17 is a schematic diagram showing a sectional structure of a quantum dot (QD) according to some example embodiments. The quantum dot (QD) may have a core-shell structure using a Group III-V or Group II-VI compound semiconductor. For example, the quantum dot may have a core such as CdSe, InP, or the like, and a shell such as ZnS, or ZnSe. In addition, the quantum dot may include a ligand for stabilizing the core and the shell. For example, the core may have a diameter of 1 nm to 30 nm, specifically 3 nm to 10 nm. The shell may have a thickness of 0.1 nm to 20 nm, specifically 0.5 nm to 2 nm.

The quantum dot may realize various colors according to sizes. In particular, when used as a substitute for a phosphor, the quantum dot may substitute for a red or green phosphor. When used, the quantum dot may realize a narrow full width at half maximum (for example, about 35 nm).

Figure 18:
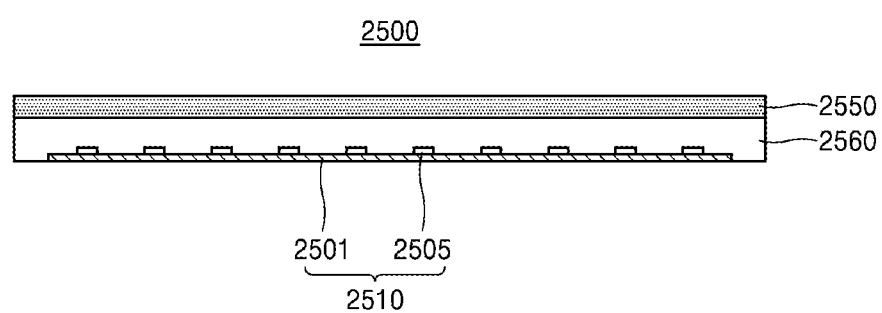
FIG. 18, FIG. 19A, and FIG. 19B are schematic cross-sectional views of backlight units according to some example embodiments.
Figure 19A:
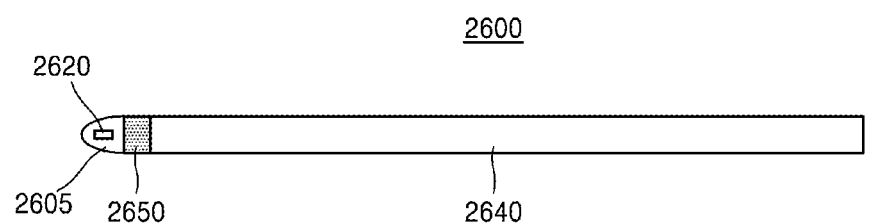
Figure 19B:
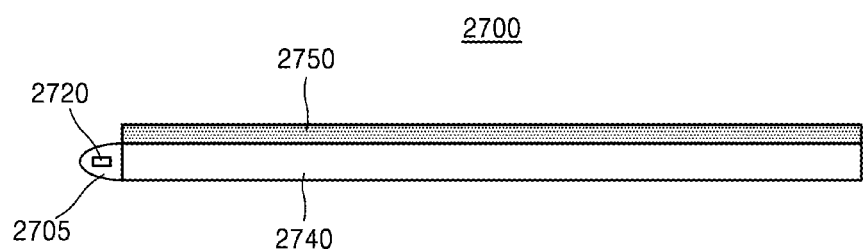

The wavelength converting material may be contained in the encapsulant (see FIGS. 18, 19A, and 19B). Alternatively, the wavelength converting material, which is manufactured in a film shape in advance, may be attached to a surface of an optical structure such as an LED chip or a light guide plate. In this case, the wavelength converting material may be easily applied to a desired region while having a uniform thickness.

FIG. 18, FIG. 19A, and FIG. 19B are schematic cross-sectional views of backlight units according to some example embodiments.

In the backlight units 2500, 2600, 2700 of FIGS. 18, 19A, and 19B, wavelength converters 2550, 2650, 2750 may be arranged in the backlight units 2500, 2600, 2700 outside light sources 2505, 2605, 2705 instead of being arranged in the light sources 2505, 2605, 2705, respectively, and may convert light.

Referring to FIG. 18, the backlight unit 2500, which is a direct-type backlight unit, may include the wavelength converter 2550, a light source module 2510 on a lower side of the wavelength converter 2550, and a bottom case 2560 accommodating the light source module 2510. In addition, the light source module 2510 may include a PCB 2501 and a plurality of light sources 2505 mounted on an upper surface of the PCB 2501. The light sources 2505 may be one of the light source modules 1100, 1200 of FIGS. 14A and 14B, in which wavelength materials are omitted from the wavelength converters 1150a, 1150b.

In the backlight unit 2500 according to the present embodiment, the wavelength converter 2550 may be arranged on an upper side of the bottom case 2560. Therefore, at least a portion of light emitted from the light source module 2510 may be subjected to wavelength conversion by the wavelength converter 2550. The wavelength converter 2550 may be applied in the form of a film that is separately manufactured. Alternatively, the wavelength converter 2550 may be provided in the form of one body obtained by combining the wavelength converter 2550 with a light diffusion plate that is not illustrated.

Referring to FIGS. 19A and 19B, the backlight units 2600, 2700, which are edge-type backlight units, may include the wavelength converters 2650, 2750, light guide plates 2640, 2740, reflectors 2620, 2720 on one side of the light guide plates 2640, 2740, and the light sources 2605, 2705, respectively.

Light emitted from the light sources 2605, 2705 may be guided into the light guide plates 2640, 2740 by the reflectors 2620, 2720, respectively. In the backlight unit 2600 of FIG. 19A, the wavelength converter 2650 may be arranged between the light guide plate 2640 and the light source 2605. In the backlight unit 2700 of FIG. 19B, the wavelength converter 2750 may be arranged on a light emitting surface of the light guide plate 2740.

The wavelength converters 2550, 2650, 2750 in FIGS. 18, 19A, and 19B may include general phosphors. In particular, when a quantum dot phosphor is used in order to supplement properties of the quantum dot vulnerable to heat from the light source or moisture, structures of the wavelength converters 2550, 2650, 2750 disclosed in FIGS. 18, 19A, and 19B may be utilized for the backlight units 2500, 2600, 2700.

Figure 20:
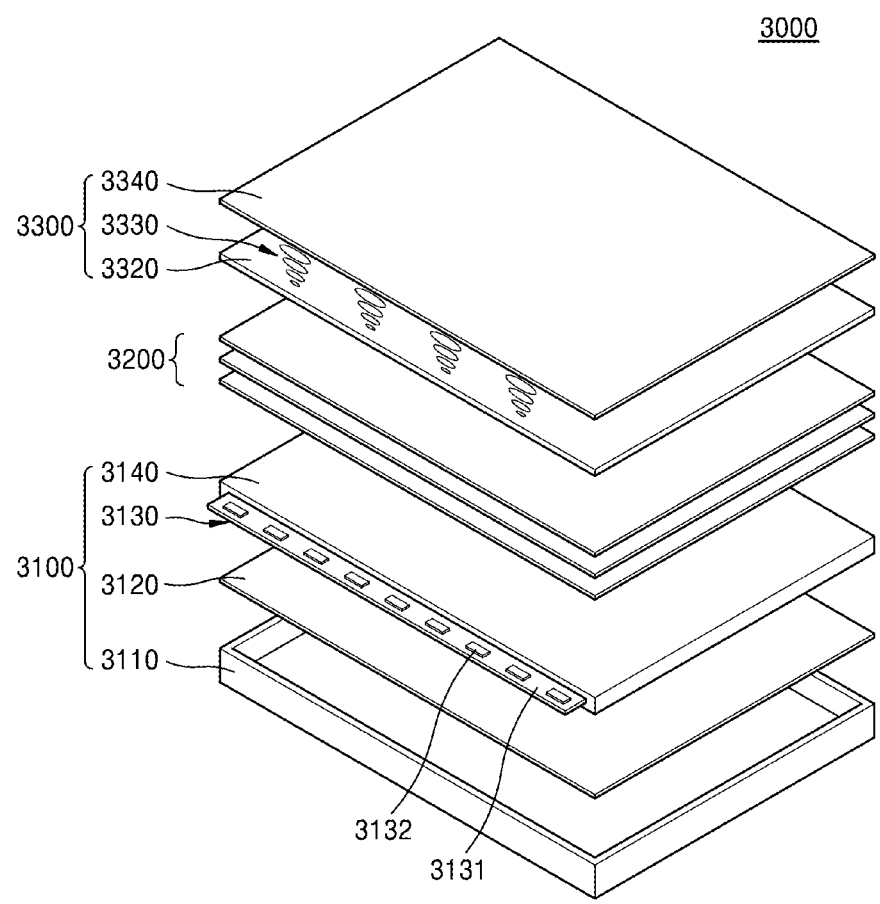
FIG. 20 is a schematic exploded perspective view of a display according to some example embodiments.

FIG. 20 is a schematic exploded perspective view of a display according to some example embodiments.

Referring to FIG. 20, the display 3000 may include a backlight unit 3100, an optical sheet 3200, and an image display panel 3300 such as a liquid crystal panel.

The backlight unit 3100 may include a bottom case 3110, a reflective plate 3120, a light guide plate 3140, and a light source module 3130 provided on at least one side of the light guide plate 3140. The light source module 3130 may include a PCB 3131 and a light source 3132. In particular, the light source 3132 may be a side view type light emitting device which is mounted to a side adjoining a light emitting surface.

The optical sheet 3200 may be arranged between the light guide plate 3140 and the image display panel 3300, and may include various sheets such as a diffusion sheet, a prism sheet, or a protective sheet.

The image display panel 3300 may display an image using light emitted from the optical sheet 3200. The image display panel 3300 may include an array substrate 3320, a liquid crystal layer 3330, and a color filter substrate 3340. The array substrate 3320 may include pixel electrodes arranged in a matrix shape, thin film transistors applying driving voltages to the pixel electrodes, and signal lines for operating the thin film transistors. The color filter substrate 3340 may include a transparent substrate, a color filter, and a common electrode. The color filter may include filters for selectively passing light of a specific wavelength among white light emitted from the backlight unit 3100. The liquid crystal layer 3330 may be rearranged by an electric field formed between the pixel electrodes and the common electrode, thereby adjusting light transmittance. Light adjusted in terms of light transmittance passes through the color filter of the color filter substrate 3340, thereby displaying an image. The image display panel 3300 may further include a drive circuit unit processing an image signal, or the like.

According to the display 3000 of the present embodiment, since the light source 3132 emitting blue light, green light, and red light, which have relatively small full widths at half maximum, is used, the emitted light may realize high-color purity blue, green, and red colors after passing through the color filter substrate 3340.

Figure 21:
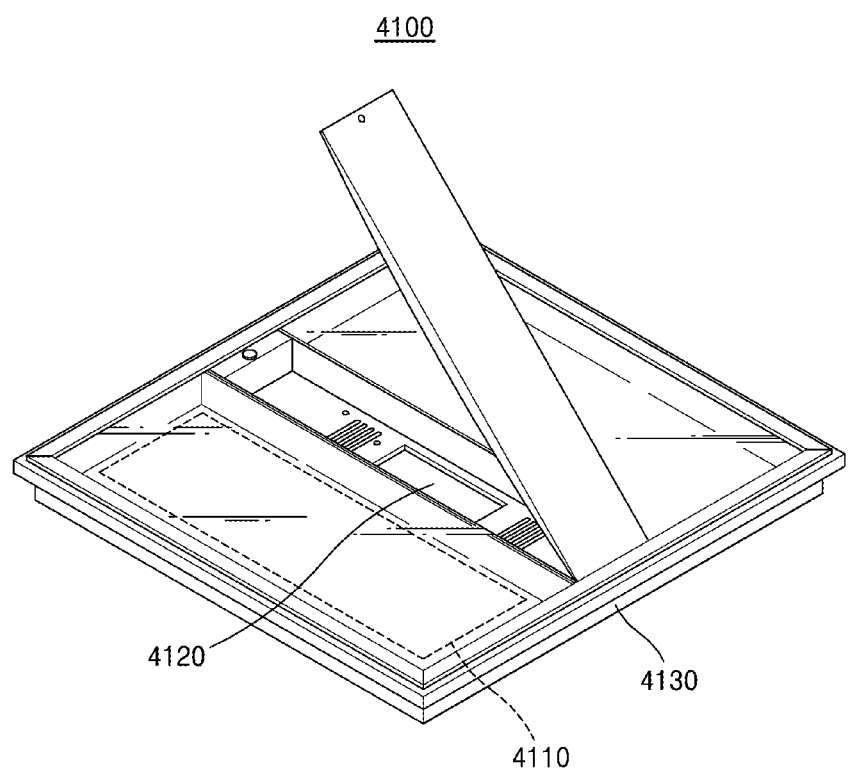
FIG. 21 is a schematic perspective view of a flat illumination device according to some example embodiments.

FIG. 21 is a schematic perspective view of a flat illumination device according to some example embodiments.

Referring to FIG. 21, a flat illumination device 4100 may include a light source module 4110, a power supply 4120, and a housing 4130 According to some example embodiments, the light source module 4110 may include a light emitting device array as a light source, and the power supply 4120 may include a light emitting device driver.

The light source module 4110 may include the light emitting device array, and may be formed in a flat shape as a whole. According to some example embodiments, the light emitting device array may include a light emitting device and a controller storing drive information of the light emitting device.

The power supply 4120 may be configured to supply power to the light source module 4110. The housing 4130 may include an accommodating space so as to accommodate the light source module 4110 and the power supply 4120, and may be formed in a hexahedral shape having one open side, without being limited thereto. The light source module 4110 may be arranged to emit light through the open side of the housing 4130.

FIG. 22 is a schematic exploded perspective view showing a bulb type lamp as an illumination device according to some example embodiments.

Specifically, an illumination device 4200 may include a socket 4210, a power source unit 4220, a heat dissipating unit 4230, a light source module 4240, and an optical unit 4250. According to some example embodiments, the light source module 4240 may include a light emitting device array, and the power source unit 4220 may include a light emitting device driver.

The socket 4210 may be configured such that the illumination device 4200 may replace existing illumination devices. Power supplied to the illumination device 4200 may be applied through the socket 4210. The power source unit 4220 may be separated into a first power source unit 4221 and a second power source unit 4222, as shown in FIG. 19. The heat dissipating unit 4230 may include an inner heat dissipating unit 4231 and an outer heat dissipating unit 4232. In addition, the inner heat dissipating unit 4231 may be connected directly to the light source module 4240 and/or the power source unit 4220, and thus allow heat to be transferred to the outer heat dissipating unit 4232. The optical unit 4250 may include an inner optical unit (not shown) and an outer optical unit (not shown), and may be configured to uniformly dispersing light emitted by the light source module 4240.

The light source module 4240 may be supplied with power from the power source unit 4220 and emit light toward the optical unit 4250. The light source module 4240 may include one or more light emitting devices 4241, a circuit board 4242, and a controller 4243, and the controller 4243 may store drive information of the light emitting devices 4241.

Figure 23:
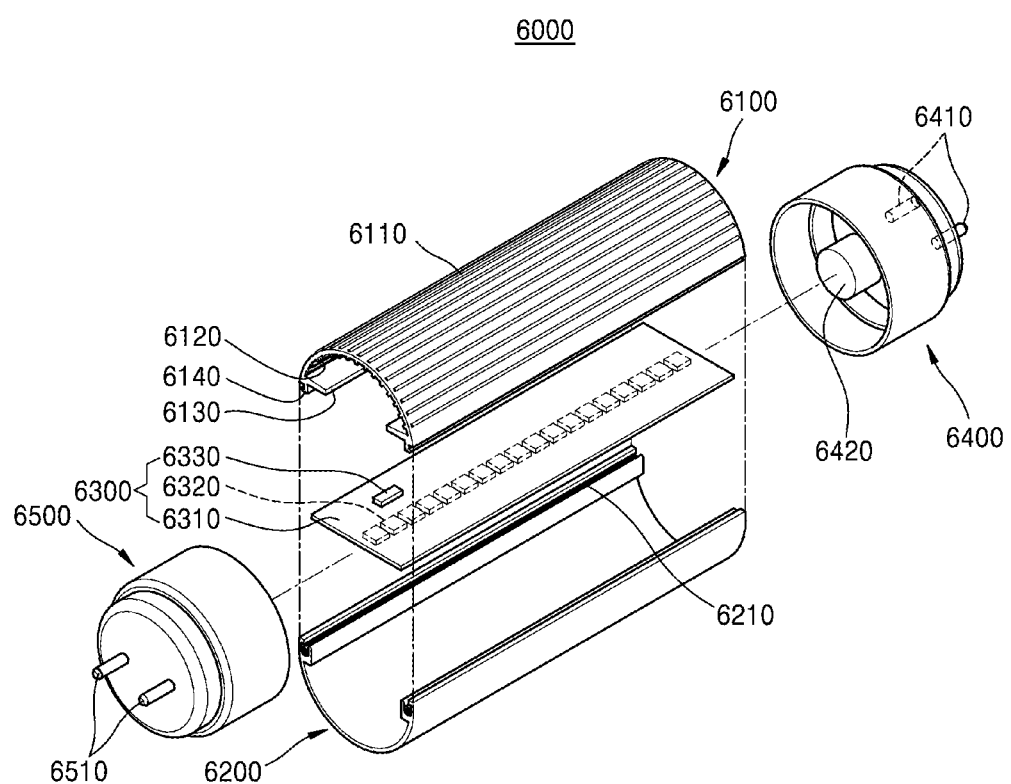
FIG. 23 is a schematic exploded perspective view showing a bar type lamp as an illumination device according to some example embodiments.

FIG. 23 is a schematic exploded perspective view showing a bar type lamp as an illumination device according to some example embodiments.

Specifically, an illumination device 6000 includes a heat dissipating unit 6100, a cover 6200, a light source module 6300, a first socket 6400, and a second socket 6500. A plurality of dissipation pins 6110, 6120 may be formed in an uneven shape on inner and/or outer surfaces of the heat dissipating unit 6100. In addition, the dissipation pins 6110, 6120 may have various shapes, and may be arranged at various intervals. A protrusion-shaped support 6140 is formed inside the heat dissipating unit 6100. The light source module 6300 may be secured to the support 6140. A bump 6140 may be formed at both ends of the heat dissipating unit 6100.

A groove 6210 is formed on the cover 6200, and the bump 6140 of the heat dissipating unit 6100 may be coupled to the groove 6210 in a hook coupling manner. The groove 6210 and the bump 6140 may be interchangeably formed in terms of positions thereof.

The light source module 6300 may include a light emitting device array. The light source module 6300 may include a PCB 6310, a light source 6320, and a controller 6330. As described above, the controller 6330 may store drive information of the light source 6320. Circuit wires for operating the light source 6320 are formed on the PCB 6310. In addition, the PCB 6310 may include components for operating the light source 6320.

The first and second sockets 6400, 6500, which are a pair of sockets, are respectively coupled to both ends of a cylindrical cover unit including the heat dissipating unit 6100 and the cover 6200. For example, the first socket 6400 may include an electrode terminal 6410 and a power supply 6420, and the second socket 6500 may include a dummy terminal 6510. In addition, an optical sensor and/or a communication module may be embedded in one of the first and second sockets 6400, 6500. For example, the optical sensor and/or the communication module may be embedded in the second socket 6500 including the dummy terminal 6510. As another example, the optical sensor and/or the communication module may be embedded in the first socket 6400 including the electrode terminal 6410.

FIG. 24 is a schematic exploded perspective view showing a lamp, which includes a communication module, as an illumination device according to some example embodiments.

Specifically, an illumination device 4300 according to the present embodiment has a difference from the illumination device 4200 disclosed in FIG. 22 in that the illumination device 4300 includes a reflective plate 4310 on an upper side of the light source module 4240, and the reflective plate 4310 may uniformly spread light from a light source toward lateral and rear sides thereof, thereby reducing glare.

A communication module 4320 may be mounted on an upper side of the reflective plate 4310, and home-network communication may be realized through the communication module 4320. For example, the communication module 4320 may be a wireless communication module using Zigbee, WiFi, or LiFi, and may allow control such as On/Off or brightness adjustment of illumination devices, which are mounted inside and outside a home, using a smart phone or a wireless controller. In addition, by use of a LiFi communication module using a visible light wavelength of the illumination device mounted inside and outside the home, electronics and automotive systems, such as TVs, refrigerators, air conditioners, door locks, automobiles, and the like, inside and outside the home may be controlled.

A cover unit 4330 may cover the reflective plate 4310 and the communication module 4320.

Figure 25:
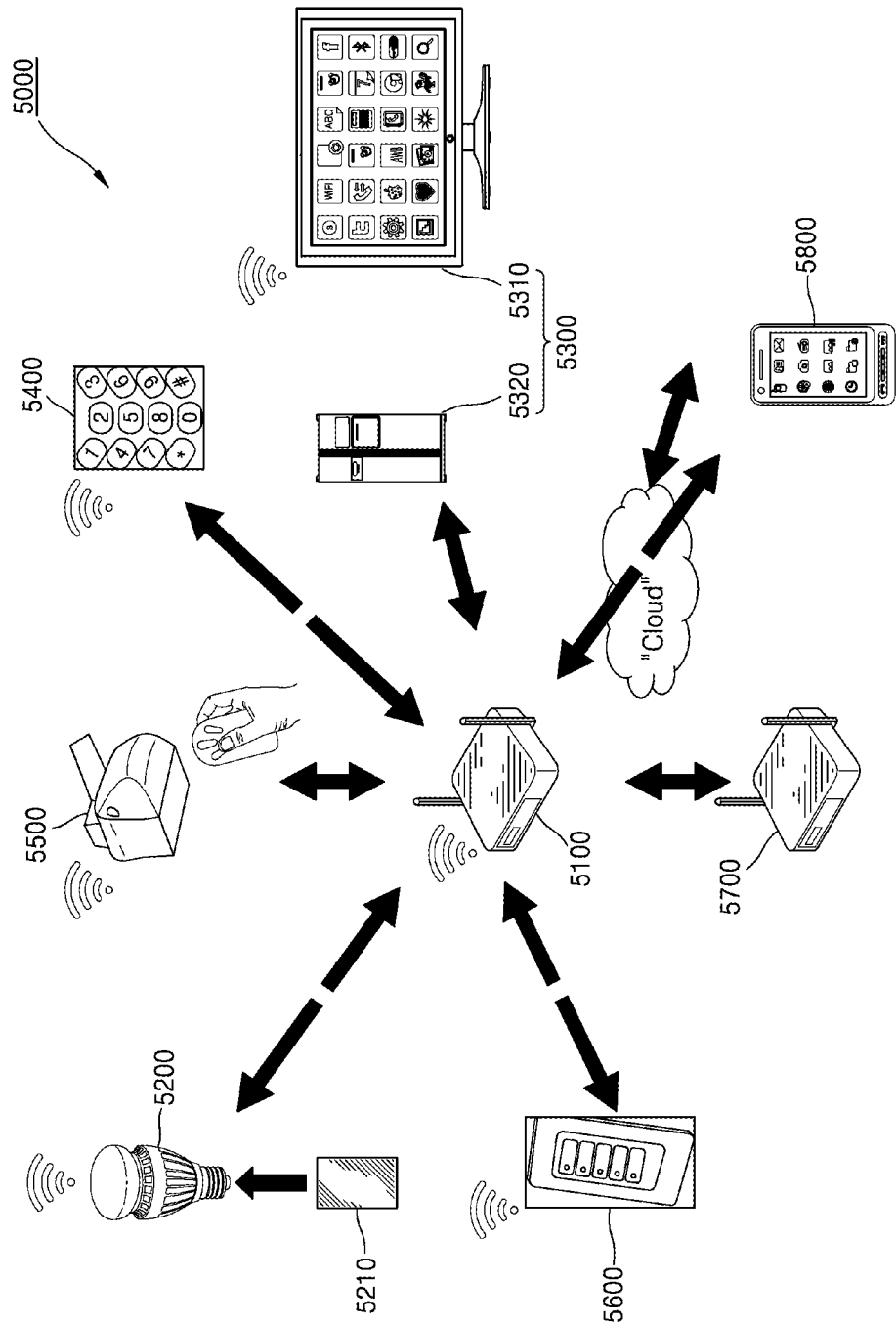
FIG. 25 is a schematic diagram for describing an indoor illumination control network system according to some example embodiments.

FIG. 25 is a schematic diagram for explaining an indoor illumination control network system.

A network system 5000 according to the present embodiment may be a complex smart illumination network system, in which illumination techniques using light emitting devices such as LEDs or the like, internet-of-things (JOT) techniques, wireless communication techniques, and the like are fused. The network system 5000 may be realized using various illumination devices and wired and wireless communication devices, and may be realized by sensors, controllers, communication means, software for network control and maintenance, and the like.

The network system 5000 may be applied to closed spaces such as homes and offices, which are defined inside buildings, as well as applied to open spaces such as parks, streets, and the like. The network system 5000 may be realized based on an internet-of-things environment such that various information may be collected/processed to be provided to users. Here, an LED lamp 5200 included in the network system 5000 may control illumination of the LED lamp 5200 itself by receiving information about a surrounding environment from a gateway 5100. In addition, the LED lamp 5200 may serve to perform an operation status check, control, and the like of other devices 5300 to 5800 included in the internet-of-things environment, based on a visible light communication function and the like of the LED lamp 5200.

Referring to FIG. 25, the network system 5000 may include: the gateway 5100 for processing data transmitted and received according to different communication protocols; the LED lamp 5200 communicably connected to the gateway 5100, the LED lamp 5200 including an LED light emitting device; and a plurality of devices 5300 to 5800 communicably connected to the gateway 5100 according to various wireless communication manners. To realize the network system 5000 based on the internet-of-things environment, each of the LED lamp 5200 and the devices 5300 to 5800 may include at least one communication module. In an embodiment, the LED lamp 5200 may be connected to the gateway 5100 communicably by a wireless communication protocol such as WiFi, Zigbee, LiFi, or the like, and for this purpose, may have at least one communication module 5210 for lamps.

As described above, the network system 5000 may be applied to closed spaces such as homes or offices as well as applied to open spaces such as streets or parks. When the network system 5000 is applied to a home, the plurality of devices 5300 to 5800, which is included in the network system 5000 and communicably connected to the gateway 5100 based on an internet-of-things technique, may include home appliances 5300, a digital door lock 5400, a garage door lock 5500, an illumination switch 5600 mounted on a wall or the like, a router 5700 for wireless communication network relay, a mobile device 5800 such as a smart phone, a tablet PC, or a laptop computer, and the like.

In the network system 5000, using a wireless communication network (Zigbee, WiFi, LiFi, or the like) mounted in the home, the LED lamp 5200 may check operation status of the various devices 5300 to 5800, or automatically adjust illuminance of the LED lamp 5200 itself according to surrounding environments/situations. In addition, by use of LiFi communications using visible light emitted by the LED lamp 5200, the devices 5300 to 5800 included in the network system 5000 may be controlled.

First, the LED lamp 5200 may automatically adjust the illuminance of the LED lamp 5200, based on surrounding environment information, which is transferred from the gateway 5100 through the communication module 5210 for lamps, or which is collected by a sensor mounted in the LED lamp 5200. For example, according to a kind of program broadcasted on a television 5310 or brightness of a screen of the television 5310, illumination brightness of the LED lamp 5200 may be automatically adjusted. For this purpose, the LED lamp 5200 may receive operation information of the television 5310 from the communication module 5210 for lamps, which is connected to the gateway 5100. The communication module 5210 for lamps may be integrated with a sensor and/or a controller included in the LED lamp 5200, and thus be modularized.

For example, when a program value broadcasted on a TV is a human drama, according to a pre-set value, a color temperature of illumination may be reduced to 12000K or less, for example, 5000K, and a color may be adjusted to provide a cozy atmosphere. On the other hand, when the program value is a gag program, the network system 5000 may be configured such that a color temperature of illumination is increased to 5000K or more according to a set value, and that the illumination is adjusted to blue-based white illumination.

In addition, while no one is present in the home, if a certain time period elapses after the digital door lock 5400 is locked, waste of electricity may be reduced and/or prevented by turning off all of turned-on LED lamps 5200. Alternatively, when a security mode is set through the mobile device 5800, if the digital door lock 5400 is locked while no one is present in the home, the LED lamp 5200 may be maintained in a turn-on state.

Operations of the LED lamp 5200 may be controlled according to surrounding environment information collected by various sensors connected to the network system 5000. For example, when the network system 5000 is realized in a building, illumination, position sensors, and communication modules in the building are combined, and position information of persons in the building is collected, whereby the illumination may be turned on or off. In addition, the collected information is provided in real time, thereby allowing management of facilities or efficient utilization of idle spaces. Generally, since an illumination device such as the LED lamp 5200 is arranged in almost every space of each of floors in the building, various information in the building is collected through a sensor provided integrally with the LED lamp 5200, and may be used for management of facilities, utilization of idle spaces, or the like.

The LED lamp 5200, an image sensor, a storage device, the communication module 5210 for lamps, and the like are combined, thereby providing a device which may be utilized to maintain building security or to sense and handle emergencies. For example, when a sensor sensing smoke, temperature, or the like is attached to the LED lamp 5200, occurrence of fire, or the like may be quickly sensed, thereby minimizing damage. In addition, illumination brightness may be adjusted in consideration of outdoor weather, an amount of sunshine, or the like, thereby saving energy and providing a comfortable illumination environment.

As described above, the network system 5000 may be applied to closed spaces such as homes, offices, or buildings as well as applied to open spaces such as streets, parks, or the like. If and/or when the network system 5000 is applied to an open space having no physical limit, realization of the network system 5000 may be relatively difficult due to distance limits of wireless communications, communication interference caused by various obstacles, or the like. A sensor, a communication module, and the like are mounted in each of illumination devices, and each of the illumination devices is used as an information collecting means and a communication relay means, whereby the network system 5000 may be more efficiently realized in an open environment as described above. Hereinafter, descriptions will be made with reference to FIG. 26.

Figure 26:
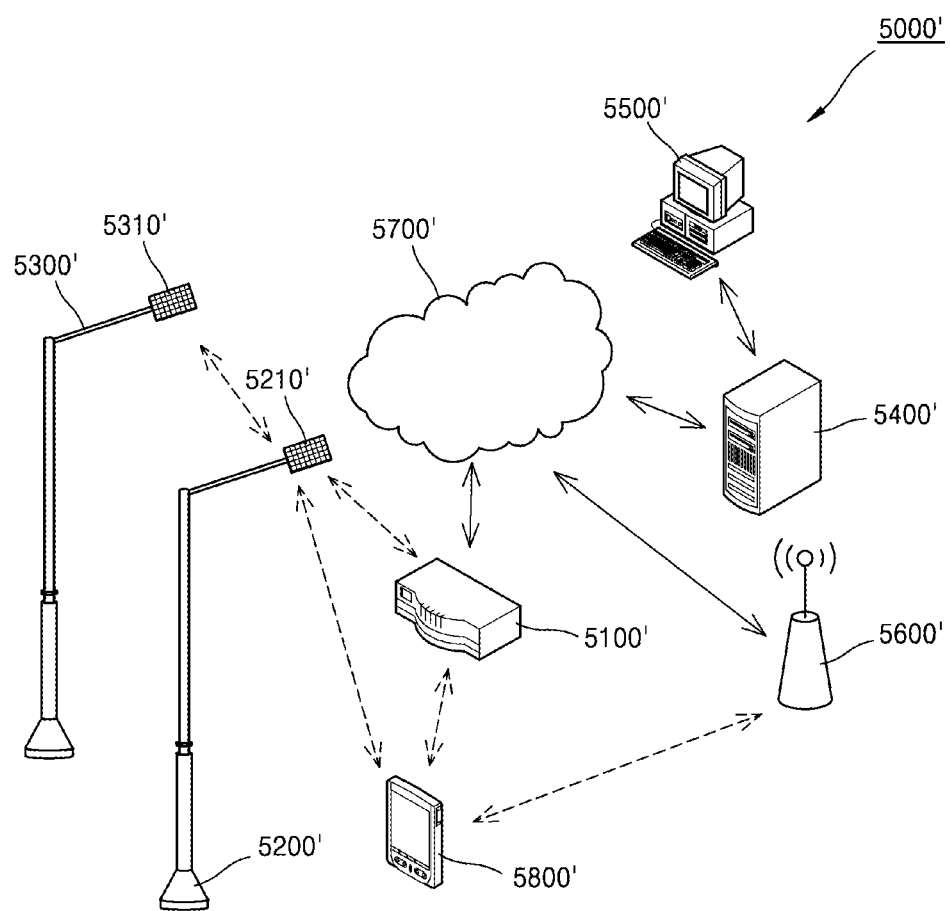
FIG. 26 is a conceptual diagram showing an embodiment of a network system applied to an open space according to some example embodiments.

FIG. 26 is a conceptual diagram showing an embodiment of a network system 5000' applied to an open space according to some example embodiments.

Referring to FIG. 26, the network system 5000' according to the present embodiment may include: a communication connecting device 5100'; a plurality of illumination devices 5200', 5300' communicably connected to the communication connecting device 5100', the plurality of illumination devices 5200' being arranged at desired (and/or alternatively predetermined) intervals; a server 5400'; a computer 5500' for managing the server 5400'; a communication base station 5600'; a communication network 5700' connecting the communicable equipment set forth above to each other; a mobile device 5800', and the like.

Each of the plurality of illumination devices 5200', 5300' mounted in an exterior open space may include smart engines 5210', 5310'. The smart engines 5210', 5310' may include a sensor collecting information of a surrounding environment, a communication module, and the like, in addition to a light emitting device for emitting light, and a driver for driving the light emitting device. By the communication module, the smart engines 5210', 5310' may be communicated with other surrounding equipment according to a communication protocol such as WiFi, Zigbee, LiFi, or the like.

As an example, one smart engine 5210' may be communicably connected to another smart engine 5310'. Here, a WiFi extension (WiFi mesh) technique may be applied to communications between the smart engines 5210', 5310'. At least one smart engine 5210' may be connected to the communication connecting device 5100', which is connected to the communication network 5700', by wired/wireless communications. To improve an efficiency of communications, several smart engines 5210', 5310' are combined into one group to be connected to the communication connecting device 5100'.

The communication connecting device 5100' is an access point (AP) which enables wired/wireless communications, and may relay communications between the communication network 5700' and another device. The communication connecting device 5100' may be connected to the communication network 5700' by at least one of wired/wireless manners. As an example, the communication connecting device 5100' may be mechanically accommodated in one of the illumination devices 5200', 5300'.

The communication connecting device 5100' may be connected to the mobile device 5800' through a communication protocol such as WiFi or the like. A user of the mobile device 5800' may receive surrounding environment information, which is collected by the plurality of smart engines 5210', 5310', through the communication connecting device 5100' connected to the smart engine 5210' of the illumination device 5200' in the vicinity of the mobile device 5800'. The surrounding environment information may include surrounding traffic information, weather information, and the like. The mobile device 5800' may be connected to the communication network 5700' in a wireless cellular communication manner, such as 3G, 4G, or the like, through the communication base station 5600'.

The server 5400' connected to the communication network 5700' may monitor operation status or the like of each of the illumination devices 5200', 5300' while receiving information collected by the smart engines 5210', 5310' which are respectively mounted in the illumination devices 5200', 5300'. To manage each of the illumination devices 5200', 5300' based on monitoring results of the operation status of each of the illumination devices 5200', 5300', the server 5400' may be connected to the computer 5500' providing a management system. The computer 5500' may execute software or the like which may monitor and manage operation status of each of the illumination devices 5200', 5300', particularly each of the smart engines 5210', 5310'.

According to the one or more of the above embodiments, in the semiconductor light emitting devices 800 and 900, the light emitting packages 100 through 600, and the light emitting module 700, thermal droop is reduced at an operation temperature and a luminous efficiency is improved.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A light emitting package, comprising:
a light emitting stack including a sequential stack of a first conductivity type semiconductor layer, an active layer, and a second conductivity type semiconductor layer;
an encapsulation layer at least partially surrounding the second conductivity type semiconductor layer; and
a wavelength conversion layer on the first conductivity type semiconductor layer,
wherein at least one of the encapsulation layer and the wavelength conversion layer has a greater coefficient of thermal expansion (CTE) than a compound semiconductor of $Al_xIn_yGa_zN$ ($0 \leq x \leq 1$, $0 \leq y \leq 1$, $0 \leq z \leq 1$, $x+y+z=1$).

2. The light emitting package of claim 1, wherein the at least one of the encapsulation layer and the wavelength conversion layer has a greater CTE than GaN in a temperature range of about 50° C. to about 110° C.

3. The light emitting package of claim 2, wherein the at least one of the encapsulation layer and the wavelength conversion layer has a greater CTE than GaN at 95° C.

4. The light emitting package of claim 1, wherein the at least one of the encapsulation layer and the wavelength conversion layer has a CTE of about 10 ppm/K to about 100 ppm/K in a temperature range of about 50° C. to about 110° C.

5. The light emitting package of claim 4, wherein the at least one of the encapsulation layer and the wavelength conversion layer has a CTE of about 65 ppm/K to about 95 ppm/K in the temperature range of about 50° C. to about 110° C.

6. The light emitting package of claim 1, wherein a deterioration rate of luminous flux is less than −5% if a temperature of the light emitting package increases from about 25° C. to about 85° C.

7. The light emitting package of claim 1, wherein an optical reflectance of the encapsulation layer is about 80% to about 100%.

8. The light emitting package of claim 1, wherein the encapsulation layer has a glass transition temperature (Tg) that is equal to or less than about 60° C.

9. The light emitting package of claim 8, wherein the at least one of the encapsulation layer and the wavelength conversion layer has a glass transition temperature that is between about 30° C. and about 60° C.

10. The light emitting package of claim 1, wherein,
a surface of the first conductivity type semiconductor layer is roughened, and
the surface of the first conductivity type semiconductor layer faces the wavelength conversion layer.

11. The light emitting package of claim 1, further comprising:
a stress applying structure configured to apply tensile stress to the light emitting stack.

12. The light emitting package of claim 1, wherein the at least one of the encapsulation layer and the wavelength conversion layer includes a white silicone (W-Silicone) resin, and the W-Silicone resin is a silicone material including ceramic oxide particles.

13. The light emitting package of claim 12, wherein the W-Silicone resin has a glass transition temperature that is equal to or lower than about 60° C. and has a CTE of about 65 ppm/K to about 95 ppm/K at a temperature that is equal to or higher than the glass transition temperature.

14. The light emitting package of claim 13, wherein the W-Silicone resin has a CTE of about 80 ppm/K at a temperature that is equal to or higher than about 60° C.

15. The light emitting package of claim 1, wherein the at least one of the encapsulation layer and the wavelength conversion layer includes a white liquid molding compound (W-LMC), and the W-LMC is a liquid molding compound (LMC) that includes ceramic oxide particles and is an epoxy-based material.

16. The light emitting package of claim 15, wherein the W-LMC has a glass transition temperature that is equal to or lower than about 145° C. and has a CTE of about 30 ppm/K to about 60 ppm/K at a temperature that is equal to or higher than the glass transition temperature.

17. The light emitting package of claim 16, wherein the W-LMC has a CTE of about 40 ppm/K at a temperature that is equal to or higher than about 145° C.

18. The light emitting package of claim 1, wherein the at least one of the encapsulation layer and the wavelength conversion layer has a greater CTE than an epoxy molding compound (EMC) and a liquid molding compound (LMC).

19. The light emitting package of claim 1, wherein the at least one of the encapsulation layer and the wavelength conversion layer has a greater CTE than an overall CTE of the light emitting stack.

20. The light emitting package of claim 1, wherein the at least one of the encapsulation layer and the wavelength conversion layer includes the encapsulation layer, and the encapsulation layer includes metal particles or metal oxide particles.

\* \* \* \* \*